(12) United States Patent
Yamada

(10) Patent No.: US 7,989,811 B2
(45) Date of Patent: Aug. 2, 2011

(54) MANUFACTURING METHOD OF SEMICONDUCTOR DEVICE

(75) Inventor: Daiki Yamada, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/010,887

(22) Filed: Jan. 21, 2011

(65) Prior Publication Data

US 2011/0114952 A1    May 19, 2011

Related U.S. Application Data

(62) Division of application No. 11/563,939, filed on Nov. 28, 2006, now Pat. No. 7,879,687.

(30) Foreign Application Priority Data

Dec. 2, 2005 (JP) ................................. 2005-348968

(51) Int. Cl.
*H01L 21/10* (2006.01)
(52) U.S. Cl. .................... 257/67; 257/72; 257/E21.122; 438/455
(58) Field of Classification Search .......... 438/149–167, 438/455–465; 257/49, 59, 66, 67, 72, E21.122
See application file for complete search history.

(56) References Cited

U.S. PATENT DOCUMENTS

| | | | |
|---|---|---|---|
| 5,013,681 A | 5/1991 | Godbey et al. | |
| 5,244,830 A | 9/1993 | Kang et al. | |
| 5,757,456 A | 5/1998 | Yamazaki et al. | |
| 5,821,138 A | 10/1998 | Yamazaki et al. | |
| 6,118,502 A | 9/2000 | Yamazaki et al. | |
| 6,376,333 B1 | 4/2002 | Yamazaki et al. | |
| 2004/0080262 A1* | 4/2004 | Park et al. | 313/498 |
| 2004/0164302 A1 | 8/2004 | Arai et al. | |
| 2004/0232413 A1* | 11/2004 | Yamazaki et al. | 257/43 |
| 2005/0070038 A1 | 3/2005 | Yamazaki et al. | |
| 2005/0094071 A1* | 5/2005 | Akiyama et al. | 349/122 |
| 2005/0130389 A1 | 6/2005 | Yamazaki et al. | |
| 2005/0285231 A1 | 12/2005 | Arao et al. | |

FOREIGN PATENT DOCUMENTS

| | | |
|---|---|---|
| EP | 1453088 A2 | 9/2004 |
| JP | 2005-229098 A | 8/2005 |
| WO | WO 2006/011664 A1 | 2/2006 |

\* cited by examiner

*Primary Examiner* — Brook Kebede
(74) *Attorney, Agent, or Firm* — Fish & Richardson P.C.

(57) ABSTRACT

A manufacturing method of a highly reliable semiconductor with a waterproof property. The method includes the steps of: sequentially forming a peeling layer, an inorganic insulating layer, and an element formation layer including an organic compound layer, over a substrate; separating the peeling layer and the inorganic insulating layer from each other, or separating the substrate and the inorganic insulating layer from each other; removing a part of the inorganic insulating layer or a part of the inorganic insulating layer and the element formation layer, thereby isolating at least the inorganic insulating layer into a plurality of sections so that at least two layers among the organic compound layer, a flexible substrate, and an adhesive agent are stacked at outer edges of the isolated inorganic insulating layers; and cutting a region where at least two layers among the organic compound layer, the flexible substrate, and the adhesive agent are stacked.

18 Claims, 15 Drawing Sheets

MANUFACTURING METHOD OF SEMICONDUCTOR DEVICE

CROSS-REFERENCE TO RELATED APPLICATIONS

This application is a divisional of U.S. application Ser. No. 11/563,939, filed Nov. 28, 2006, now allowed, which claims the benefit of a foreign priority application filed in Japan as Serial No. 2005-348968 on Dec. 2, 2005, both of which are incorporated by reference.

1. FIELD OF THE INVENTION

The present invention relates to a manufacturing method of a semiconductor device using a peeling technique.

2. DESCRIPTION OF THE RELATED ART

As a conventional manufacturing method of a thin semiconductor device, there is known an method which includes the steps of: 1) providing a metal oxide film between a highly heat-resistant substrate and a base insulating layer of a thin film integrated circuit, 2) weakening the metal oxide film by crystallization, thereby peeling the thin film integrated circuit, and 3) attaching a flexible substrate which is separately prepared to the base insulating layer of the thin film integrated circuit with an adhesive agent (for example, see Japanese Published Patent Application No. 2005-229098).

However, when the base insulating layer is formed of an inorganic insulating layer such as a silicon oxide film or a silicon nitride film, and an adhesive agent is formed of an organic compound such as polymers or an organic resin, there is a problem in that adhesion between the base insulating layer and the adhesive agent is low.

Further, when the thin film integrated circuit and the flexible substrate which are attached to each other by the aforementioned method or the like are divided into a plurality of sections, an interface between the base insulating layer and the adhesive agent is exposed at the side face of each divided section. In this condition, given that the base insulating layer is formed of an inorganic insulating layer such as a silicon oxide film or a silicon nitride film, and the adhesive agent is formed of an organic compound such as polymers or an organic resin, moisture and the like can easily enter from the interface because the adhesion between the base insulating layer and the adhesive agent is low. Thus, there is a problem in that the flexible substrate could peel off the base insulating layer. If the flexible substrate peels off the base insulating layer, there arises another problem that the thin film integrated circuit is exposed, and so the thin film integrated circuit cannot operate normally because of moisture.

SUMMARY OF THE INVENTION

In view of the foregoing problems, it is an object of the invention to provide a manufacturing method of a highly reliable semiconductor device with a waterproof property.

It is the gist of the invention to provide a manufacturing method of a semiconductor device, which includes the steps of: sequentially forming a peeling layer, an inorganic insulating layer, and an element formation layer including an organic compound layer, over a substrate; separating the element formation layer which has the inorganic insulating layer formed on its surface, from the substrate; removing a part of the inorganic insulating layer or a part of the inorganic insulating layer and the element formation layer, thereby isolating at least the inorganic insulating layer into a plurality of sections so that at least two layers among the organic compound layer, a flexible substrate, and an adhesive agent are stacked at outer edges of the isolated inorganic insulating layers; and cutting a region where at least two layers among the organic compound layer, the flexible substrate, and the adhesive agent adhere to each other.

One aspect of the invention provides a manufacturing method of a semiconductor device which includes the steps of: forming a peeling layer over a substrate; forming an inorganic insulating layer over the peeling layer; forming an element formation layer including an organic compound layer over the inorganic insulating layer; attaching a first flexible substrate to the element formation layer; separating the element formation layer which has the inorganic insulating layer formed on its surface, from the substrate; removing a part of the inorganic insulating layer, thereby isolating the inorganic insulating layer into a plurality of sections as well as exposing a part of the organic compound layer in the element formation layer; attaching a second flexible substrate to the isolated inorganic insulating layers and an exposed portion of the organic compound layer in the element formation layer; and cutting a region where the first flexible substrate, the exposed portion of the organic compound layer in the element formation layer, and the second flexible substrate overlap one another.

Note that an organic resin layer may be formed between the aforementioned element formation layer and the first flexible substrate.

One aspect of the invention provides a manufacturing method of a semiconductor device which includes the steps of: forming a peeling layer over a substrate; forming an inorganic insulating layer over the peeling layer; forming an element formation layer over the inorganic insulating layer; attaching a first flexible substrate to the element formation layer; separating the element formation layer which has the inorganic insulating layer formed on its surface, from the substrate; removing a part of the inorganic insulating layer and the element formation layer, thereby isolating the inorganic insulating layer and the element formation layer into a plurality of sections as well as exposing a part of the first flexible substrate; attaching a second flexible substrate to the isolated inorganic insulating layers and an exposed portion of the first flexible substrate; and cutting a region where the exposed portion of the first flexible substrate and the second flexible substrate overlap one another.

One aspect of the invention provides a manufacturing method of a semiconductor device which includes the steps of: forming a peeling layer over a substrate; forming an inorganic insulating layer over the peeling layer; forming an element formation layer over the inorganic insulating layer; attaching a first flexible substrate to the element formation layer with a first adhesive agent; separating the element formation layer which has the inorganic insulating layer formed on its surface, from the substrate; removing a part of the inorganic insulating layer and the element formation layer, thereby isolating the inorganic insulating layer and the element formation layer into a plurality of sections as well as exposing a part of the first adhesive agent; attaching a second flexible substrate to the isolated inorganic insulating layers and an exposed portion of the first adhesive agent with a second adhesive agent; and cutting a region where the first flexible substrate, the exposed portion of the first adhesive agent, the second adhesive agent, and the second flexible substrate overlap one another.

One aspect of the invention provides a manufacturing method of a semiconductor device which includes the steps of: forming a peeling layer over a substrate; forming an inorganic insulating layer over the peeling layer; forming an element formation layer over the inorganic insulating layer; forming an organic resin layer over the element formation layer; attaching a first flexible substrate to the organic resin layer; separating the element formation layer which has the inorganic insulating layer formed on its surface, from the substrate; removing a part of the inorganic insulating layer and the element formation layer, thereby isolating the inorganic insulating layer and the element formation layer into a plurality of sections as well as exposing a part of the organic resin layer; attaching a second flexible substrate to the isolated inorganic insulating layers and an exposed portion of the organic resin layer; and cutting a region where the first flexible substrate, the exposed portion of the organic resin layer, and the second flexible substrate overlap one another.

One aspect of the invention provides a manufacturing method of a semiconductor device which includes the steps of: forming a peeling layer over a substrate; forming an inorganic insulating layer over the peeling layer; forming an element formation layer over the inorganic insulating layer; forming an organic resin layer over the element formation layer; attaching a first flexible substrate to the organic resin layer with a first adhesive agent; separating the element formation layer which has the inorganic insulating layer formed on its surface, from the substrate; removing a part of the inorganic insulating layer and the organic resin layer, thereby isolating the inorganic insulating layer, the element formation layer, and the organic resin layer into a plurality of sections as well as exposing a part of the first adhesive agent; attaching a second flexible substrate to the isolated inorganic insulating layers and an exposed portion of the first adhesive agent with a second adhesive agent; and cutting a region where the first flexible substrate, the exposed portion of the first adhesive agent, the second adhesive agent, and the second flexible substrate overlap one another.

One aspect of the invention provides a manufacturing method of a semiconductor device which includes the steps of: forming a peeling layer over a substrate; forming an inorganic insulating layer over the peeling layer; forming an element formation layer over the inorganic insulating layer; attaching a first flexible substrate to the element formation layer; separating the element formation layer which has the inorganic insulating layer formed on its surface, off the substrate; removing a part of the inorganic insulating layer and the element formation layer, thereby isolating the inorganic insulating layer and the element formation layer into a plurality of sections as well as exposing a part of the first flexible substrate; attaching a second flexible substrate to the isolated inorganic insulating layers and an exposed portion of the first flexible substrate; and cutting a region where the exposed portion of the first flexible substrate and the second flexible substrate overlap one another.

One aspect of the invention provides a manufacturing method of a semiconductor device which includes the steps of: forming a peeling layer over a substrate; forming an inorganic insulating layer over the peeling layer; forming an element formation layer over the inorganic insulating layer; attaching an adhesive member to the element formation layer; separating the element formation layer which has the inorganic insulating layer formed on its surface, off the substrate; attaching a first flexible substrate to the inorganic insulating layer; removing the adhesive member; removing a part of the inorganic insulating layer and the element formation layer, thereby isolating the inorganic insulating layer and the element formation layer into a plurality of sections as well as exposing a part of the first flexible substrate; attaching a second flexible substrate to the isolated element formation layers and an exposed portion of the first flexible substrate; and cutting a region where the exposed portion of the first flexible substrate and the second flexible substrate overlap one another.

One aspect of the invention provides a manufacturing method of a semiconductor device which includes the steps of: forming a peeling layer over a substrate; forming an inorganic insulating layer over the peeling layer; forming an element formation layer over the inorganic insulating layer; attaching an adhesive member to the element formation layer; separating the element formation layer which has the inorganic insulating layer formed on its surface, off the substrate; attaching a first flexible substrate to the inorganic insulating layer with a first adhesive agent; removing the adhesive member; removing a part of the inorganic insulating layer and the element formation layer, thereby isolating the inorganic insulating layer and the element formation layer into a plurality of sections as well as exposing a part of the first adhesive agent; attaching a second flexible substrate to the isolated element formation layers and an exposed portion of the first adhesive agent with a second adhesive agent; and cutting a region where the first flexible substrate, the exposed portion of the first adhesive agent, the second adhesive agent, and the second flexible substrate overlap one another.

One aspect of the invention provides a manufacturing method of a semiconductor device which includes the steps of: forming a peeling layer over a substrate; forming an inorganic insulating layer over the peeling layer; forming an element formation layer over the inorganic insulating layer; separating the element formation layer which has the inorganic insulating layer formed on its surface, off the substrate; attaching a first flexible substrate to the inorganic insulating layer; removing a part of the inorganic insulating layer and the element formation layer, thereby isolating the inorganic insulating layer and the element formation layer into a plurality of sections as well as exposing a part of the first flexible substrate; attaching a second flexible substrate to the isolated inorganic insulating layers and an exposed portion of the first flexible substrate; and cutting a region where the first flexible substrate and the second flexible substrate overlap one another.

One aspect of the invention provides a manufacturing method of a semiconductor device which includes the steps of: forming a peeling layer over a substrate; forming an inorganic insulating layer over the peeling layer; forming an element formation layer over the inorganic insulating layer; separating the element formation layer which has the inorganic insulating layer formed on its surface, off the substrate; attaching a first flexible substrate to the inorganic insulating layer with a first adhesive agent; removing a part of the inorganic insulating layer and the element formation layer, thereby isolating the inorganic insulating layer and the element formation layer into a plurality of sections as well as exposing a part of the first adhesive agent; attaching a second flexible substrate to the isolated inorganic insulating layers and an exposed portion of the first adhesive agent; and cutting a region where the first flexible substrate, the exposed portion of the first adhesive agent; and the second flexible substrate overlap one another.

One aspect of the invention provides a semiconductor device which includes: a first flexible substrate; a thin film integrated circuit; an insulating layer having a contact with the thin film integrated circuit; and a second flexible substrate having a contact with the insulating layer. An interface between the insulating layer and the thin film integrated circuit and an interface between the insulating layer and the second flexible substrate are not exposed.

One aspect of the invention provides a semiconductor device which includes: a thin film integrated circuit; an insulating layer having a contact with the thin film integrated circuit; a first flexible substrate having a contact with the thin film integrated circuit and the insulating layer; and a second flexible substrate having a contact with the insulating layer. An interface between the thin film integrated circuit and the first flexible substrate, an interface between the insulating layer and the first flexible substrate, and an interface between the insulating layer and the second flexible substrate are not exposed.

One aspect of the invention provides a semiconductor device which includes: a first flexible substrate; a thin film integrated circuit; an organic resin layer having a contact with the first flexible substrate and one surface of the thin film integrated circuit; an insulating layer having a contact with an opposite surface of the thin film integrated circuit; and a second flexible substrate having a contact with the insulating layer. An interface between the insulating layer and the thin film integrated circuit and an interface between the insulating layer and the second flexible substrate are not exposed.

One aspect of the invention provides a semiconductor device which includes: a thin film integrated circuit; an organic resin layer having a contact with one surface of the thin film integrated circuit; an insulating layer having a contact with an opposite surface of the thin film integrated circuit; a first flexible substrate having a contact with the thin film integrated circuit and the organic resin layer; and a second flexible substrate having a contact with the insulating layer. An interface between the organic resin layer and the first flexible substrate, an interface between the thin film integrated circuit and the first flexible substrate, an interface between the insulating layer and the first flexible substrate, and an interface between the insulating layer and the second flexible substrate are not exposed.

One aspect of the invention provides a semiconductor device which includes: a first flexible substrate; a thin film integrated circuit; a first adhesive agent which attaches the first flexible substrate and one surface of the thin film integrated circuit to each other; an insulating layer having a contact with an opposite surface of the thin film integrated circuit; a second flexible substrate; and a second adhesive agent which attaches the insulating layer and the second flexible substrate to each other. An interface between the insulating layer and the thin film integrated circuit and an interface between the insulating layer and the second adhesive agent are not exposed.

One aspect of the invention provides a semiconductor device which includes: a first flexible substrate; a thin film integrated circuit; a first adhesive agent which attaches the first flexible substrate and one surface of the thin film integrated circuit to each other; an insulating layer having a contact with an opposite surface of the thin film integrated circuit; a second flexible substrate; and a second adhesive agent which attaches the insulating layer and the second flexible substrate to each other. An interface between the thin film integrated circuit and the first adhesive agent, an interface between the thin film integrated circuit and the insulating layer, and an interface between the insulating layer and the second adhesive agent are not exposed.

One aspect of the invention provides a semiconductor device which includes: a first flexible substrate; a thin film integrated circuit; an organic resin layer formed over one surface of the thin film integrated circuit; a first adhesive agent which attaches the first flexible substrate and the organic resin layer to each other; an insulating layer having a contact with an opposite surface of the thin film integrated circuit; a second flexible substrate; and a second adhesive agent which attaches the insulating layer and the second flexible substrate to each other. An interface between the insulating layer and the first adhesive agent, an interface between the insulating layer and the thin film integrated circuit, and an interface between the insulating layer and the second adhesive agent are not exposed.

One aspect of the invention provides a semiconductor device which includes: a first flexible substrate; a thin film integrated circuit; an organic resin layer formed over one surface of the thin film integrated circuit; a first adhesive agent which attaches the first flexible substrate and the organic resin layer to each other; an insulating layer having a contact with an opposite surface of the thin film integrated circuit; a second flexible substrate; and a second adhesive agent which attaches the insulating layer and the second flexible substrate to each other. An interface between the first adhesive agent and the organic resin layer, an interface between the organic resin layer and the thin film integrated circuit, an interface between the thin film integrated circuit and the insulating layer, and an interface between the insulating layer and the second adhesive agent are not exposed.

Note that interfaces between the first flexible substrate, the organic resin layer, and the second flexible substrate are exposed.

Alternatively, interfaces between the first flexible substrate, the organic resin layer, the thin film integrated circuit, and the second flexible substrate are exposed.

Alternatively, an interface between the first flexible substrate and the second flexible substrate is exposed.

Alternatively, interfaces between the first flexible substrate, the thin film integrated circuit, and the second flexible substrate are exposed.

Alternatively, interfaces between the first flexible substrate, the first adhesive agent, the organic resin layer, the thin film integrated circuit, the second adhesive agent, and the second flexible substrate are exposed.

Alternatively, interfaces between the first flexible substrate, the first adhesive agent, the organic resin layer, the second adhesive agent, and the second flexible substrate are exposed.

Alternatively, interfaces between the first flexible substrate, the first adhesive agent, the organic resin layer, the thin film integrated circuit, and the second flexible substrate are exposed.

Alternatively, interfaces between the first flexible substrate, the first adhesive agent, the thin film integrated circuit, the second adhesive agent, and the second flexible substrate are exposed.

Alternatively, interfaces between the first flexible substrate, the first adhesive agent, the second adhesive agent, and the second flexible substrate are exposed.

Alternatively, interfaces between the first flexible substrate, the thin film integrated circuit, the second adhesive agent, and the second flexible substrate are exposed.

Alternatively, interfaces between the first flexible substrate, the first adhesive agent, the thin film integrated circuit, and the second flexible substrate are exposed.

A semiconductor device manufactured in accordance with the invention has a structure that a stack having at least two layers among an organic compound layer, an adhesive agent made of an organic compound, and a flexible substrate made of an organic compound is exposed at the edge, while a region where an inorganic insulating layer and the adhesive agent made of an organic compound are attached to each other is not exposed at the edge. Therefore, at least two layers among the organic compound layer, the adhesive agent made of an organic compound, and the flexible substrate made of an organic compound have high adhesion at the edge, and thus moisture intrusion into the semiconductor device from the interface can be suppressed. That is, a semiconductor device in which a plurality of flexible substrates interposing thin film integrated circuits therebetween have high adhesion can be manufactured. Consequently, a semiconductor device with a waterproof property can be manufactured. That is, a highly reliable semiconductor device can be manufactured. In addition, since a flexible substrate is employed, a thin semiconductor device can be manufactured.

BRIEF DESCRIPTION OF THE DRAWINGS

In the accompanying drawings.

DETAILED DESCRIPTION OF THE INVENTION

Figure 1A:
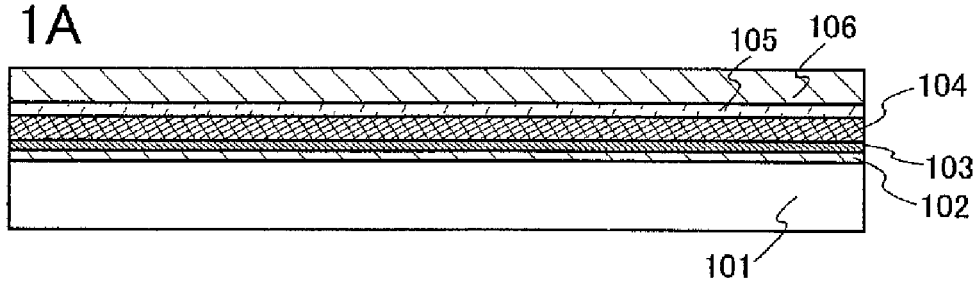
FIGS. 1A to 1E are cross-sectional views showing a manufacturing process of a semiconductor device of the invention.

Although the invention will be fully described by way of embodiment modes and embodiments with reference to the accompanying drawings, it is to be understood that various changes and modifications will be apparent to those skilled in the art. Therefore, unless such changes and modifications depart from the spirit and scope of the invention, they should be construed as being included therein. Thus, the invention is not limited to the description in the following embodiment modes. Note that like reference numerals are used to designate identical portions or portions having a similar function in different drawings for illustrating embodiment modes and embodiments, and thus their repetitive description will be omitted.

Embodiment Mode 1

In this embodiment mode, description is made of a manufacturing process of a semiconductor device having stacked layers with high adhesion at edges.

As shown in FIGS. 1A to 1E, a peeling layer 102 is formed over a substrate 101, an insulating layer 103 is formed over the peeling layer 102, and an element formation layer 104 is formed over the insulating layer 103. Then, a first flexible substrate 106 is attached to the element formation layer 104 with an adhesive agent 105.

As the substrate 101, a glass substrate or a quartz substrate can be used as well as a metal substrate, a stainless steel substrate, a silicon wafer, or the like which has an insulating layer formed on its surface. Further, a heat-resistant plastic substrate or the like which can stand the treatment temperature of the present process can also be used. A glass substrate as well as a metal substrate or a stainless steel substrate which has an insulating layer formed on its surface has no restriction on the size and shape; therefore, when a substrate which has a rectangular shape with one side of 1 meter or longer is used as the substrate 101, for example, the productivity can be significantly improved. This advantage is far superior to the case of using a circular silicon substrate.

The peeling layer 102 is formed by sputtering, plasma CVD, coating, printing, or the like, so as to have either a single-layer structure or a stacked structure by using an element selected from among tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si); an alloy material containing such an element as a main component; or a compound material containing such elements as a main component. The layer containing silicon may have any of an amorphous, microcrystalline, or polycrystalline structure.

When the peeling layer 102 is formed to have a single-layer structure, it is preferable to form a tungsten layer, a molybdenum layer, or a compound layer of tungsten and molybdenum. Alternatively, a tungsten oxide layer, a tungsten oxynitride layer, a molybdenum oxide layer, a molybdenum oxynitride layer, or a layer containing an oxide or an oxynitride of a tungsten-molybdenum compound is formed. Note that the tungsten-molybdenum compound corresponds to, for example, an alloy of tungsten and molybdenum.

When the peeling layer 102 is formed to have a stacked structure, it is preferable to form a tungsten layer, a molybdenum layer, or a compound layer of tungsten and molybdenum as a first layer, and then form a layer containing an oxide, a nitride, an oxynitride, or a nitride oxide of tungsten, molybdenum, or a tungsten-molybdenum compound as a second layer.

In the case of forming the peeling layer 102 to have a stacked structure of a tungsten layer and a tungsten oxide layer, it is possible to obtain the structure through the steps of forming a tungsten layer, and then forming an insulating layer made of an oxide over the tungsten layer, so that a tungsten oxide layer is formed at an interface between the tungsten layer and the insulating layer.

A tungsten oxide can be represented by WOx where x is in the range of $2 \leq x \leq 3$. For example, the value of x may be 2 ($WO_2$), 2.5 ($W_2O_5$), 2.75 ($W_4O_{11}$), 3 ($WO_3$), or the like.

Although the peeling layer 102 is formed in contact with the substrate 101 in the aforementioned process, the invention is not limited to this process. It is also possible to form a base insulating layer to be in contact with the substrate 101, and then form the peeling layer 102 to be in contact with the base insulating layer.

The insulating layer 103 is formed to have either a single-layer structure or a stacked structure with an inorganic compound by sputtering, plasma CVD, coating, printing, or the like. As typical examples of an inorganic compound, there are a silicon oxide, a silicon nitride oxide, a silicon oxynitride, and the like. Alternatively, in the case of forming the insulating layer 103 to have a stacked structure, a silicon oxide, a silicon nitride oxide, and a silicon oxynitride can be stacked. It is also possible to form an oxide layer prior to the formation of the insulating layer over the peeling layer 102, by applying thermal oxidation treatment, oxygen plasma treatment, N2O plasma treatment, or treatment with a solution having high oxidizing power such as ozone water to the surface of the peeling layer 102.

The element formation layer 104 includes a plurality of thin film integrated circuits formed over the insulating layer 103. The thin film integrated circuits are formed by appropriately using elements such as thin film transistors, diodes, resistors, and capacitors. Note that the element formation layer 104 includes an organic compound layer.

In addition, the thin film integrated circuits include a plurality of circuits among an antenna, a rectifier circuit, a storage capacitor, a power supply circuit such as a constant voltage circuit, a demodulation circuit, a clock generation/correction circuit, a code recognition/judgment circuit, a memory controller, a memory, an encoding circuit, a modulation circuit, an arithmetic circuit such as an interface (which functions as a so-called CPU), and the like. Note that a semiconductor device having such thin film integrated circuits functions as a semiconductor device capable of wireless data transmission.

Alternatively, the thin film integrated circuits include a plurality of circuits among a pixel circuit, a scan line driver circuit, a signal line driver circuit, a controller, an arithmetic circuit, a memory, a power supply circuit, an audio processing circuit, a transmission/reception circuit, a battery, an antenna, a rectifier circuit, a storage capacitor, a power supply circuit such as a constant voltage circuit and the like. Note that a semiconductor device having such thin film integrated circuits functions as a display device. In particular, when the semiconductor device includes an antenna, a rectifier circuit, a storage capacitor, and a power supply circuit such as a constant voltage circuit, the semiconductor device functions as a display device capable of displaying data which is transmitted wirelessly.

Further, each of the peeling layer 102, the insulating layer 103, and the element formation layer 104 can be formed by using an SOI (Silicon on Insulator) substrate, typically an SIMOX (Separation by IMplanted OXygen) substrate. Typically, a silicon wafer may be used as the peeling layer 102, a silicon oxide layer over the silicon wafer may be used as the insulating layer 103, and a layer formed thereover which includes MOS transistors formed from single crystalline silicon may be used as the element formation layer 104. In this case, referring to FIG. 1B, the insulating layer 103 and the element formation layer 104 can be separated from the peeling layer 102 by removing the silicon wafer with a polishing/grinding apparatus or with an etchant.

As the adhesive agent 105, an organic resin typified by an acrylic resin, an epoxy resin, a silicone resin, or the like is used.

As the first flexible substrate 106, a substrate made of PET (polyethylene terephthalate), PEN (polyethylene naphthalate), PES (polyethersulfone), polypropylene, polypropylene sulfide, polycarbonate, polyetherimide, polyphenylene sulfide, polyphenylene oxide, polysulfone, polyphthalamide, or the like, and an adhesive organic resin (e.g., an acrylic-based organic resin, an epoxy-based organic resin, or the like), or a paper made of a fibrous material can be used.

Alternatively, the first flexible substrate 106 may be formed with a film having a thermoplastic resin layer formed on its surface (e.g., a laminate film (including polypropylene, polyester, vinyl, polyvinyl fluoride, vinyl chloride, or the like)). The laminate film can be attached to an object in such a way that a thermoplastic resin layer (which is not an adhesive layer) provided on the outmost surface is melted by thermal treatment, and then pressure is applied thereto.

Figure 1B:
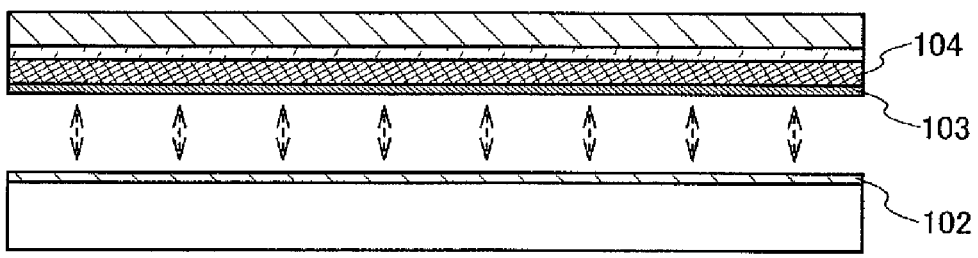

Next, the insulating layer 103 is peeled off the substrate 101 as shown in FIG. 1B.

As a method of peeling, the substrate 101 and the element formation layer 104 are separated from each other by a physical method at an interface between the peeling layer 102 and the insulating layer 103. A physical method means a mechanical method, i.e., a method for changing certain mechanical energy. Typically, a physical method means an action of applying mechanical force (e.g., peeling with the human hands or with a gripper, or a detachment process by rotating a roller). Note that it is also possible to form an opening (opening for partially exposing the peeling layer 102) in the insulating layer 103 and the element formation layer 104 by irradiating the element formation layer 104 with laser light before attaching the first flexible substrate 106 to the element formation layer 104 by use of the adhesive agent 105. Such treatment facilitates the separation at the interface between the peeling layer 102 and the insulating layer 103 in conducting a peeling process by a physical method, which leads to an improvement in yields and throughput.

As another peeling method, the following method can be used: a light-transmissive substrate is used as the substrate 101, an amorphous silicon film containing hydrogen is used as the peeling layer 102, and hydrogen contained in the amorphous silicon film serving as the peeling layer 102 is vaporized by conducting laser irradiation from the substrate 101 side, so that separation occurs at an interface between the substrate 101 and the peeling layer 102 or at an interface between the peeling layer 102 and the insulating layer 103.

It is also possible to use a method of separating the substrate 101 from the insulating layer 103 by removing the substrate 101 by mechanical polishing or by using a solution such as HF which can dissolve the substrate. In that case, the peeling layer 102 is not required.

Alternatively, before attaching the first flexible substrate 106 to the element formation layer 104 with the adhesive agent 105, an opening is formed in the element formation layer 104 and the insulating layer 103, and then a halogen fluoride gas such as $NF_3$, $BrF_3$, or $ClF_3$ is introduced into the opening, so that the peeling layer 102 is removed by etching with the halogen fluoride gas. After that, the element formation layer 104 can be peeled off the substrate 101 by attaching the first flexible substrate 106 to the element formation layer 104 with the adhesive agent 105.

As a further alternative, before attaching the first flexible substrate 106 to the element formation layer 104 with the adhesive agent 105, an opening is formed in the element formation layer 104 and the insulating layer 103 and then a halogen fluoride gas such as $NF_3$, $BrF_3$, or $ClF_3$ is introduced into the opening, so that the peeling layer 102 is partially removed by etching with the halogen fluoride gas. Then, after attaching the first flexible substrate 106 to the element formation layer 104 with the adhesive agent 105, the element formation layer 104 can be peeled off the substrate 101 by a physical method.

Here, as shown in FIG. 1B, separation is conduced at the interface between the peeling layer 102 and the insulating layer 103 by a physical method, thereby the element formation layer 104 is peeled off the substrate 101.

Figure 1C:
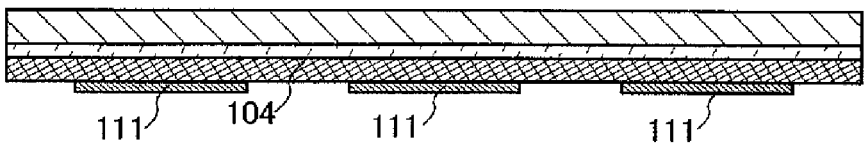
Figure 12:
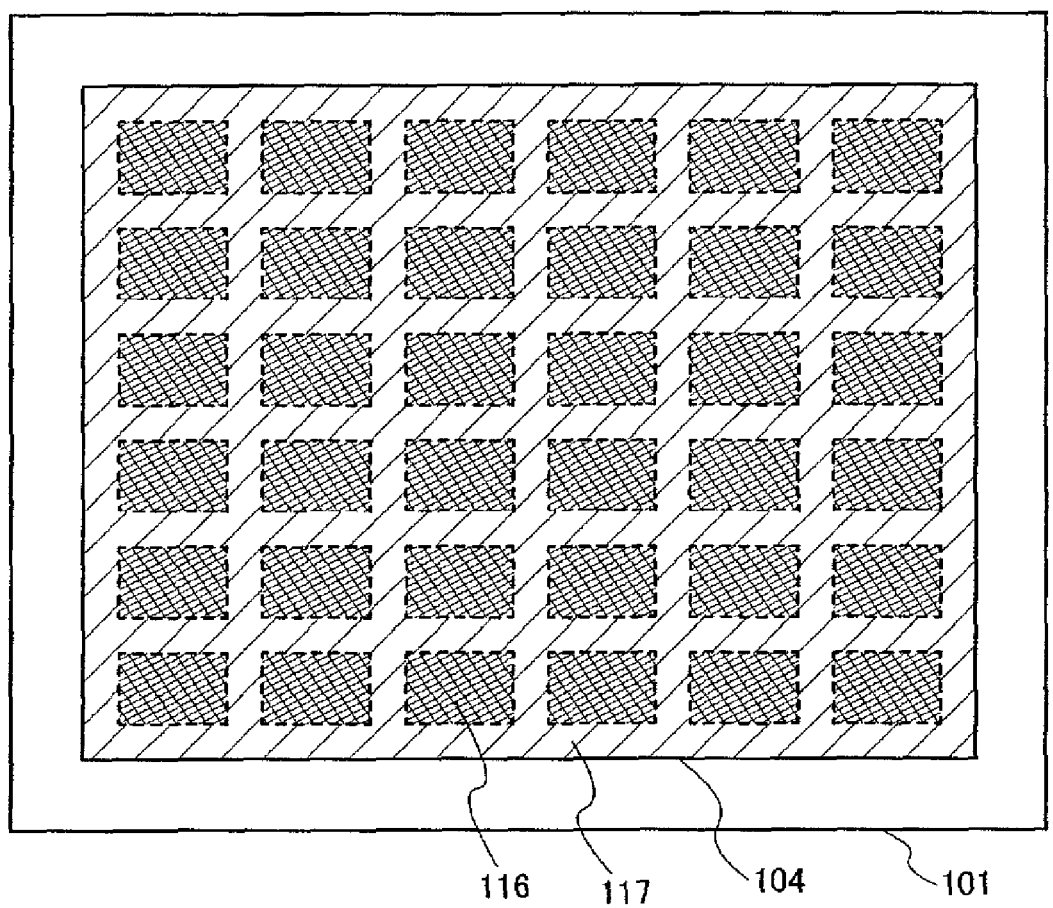
FIG. 12 is a top view showing a manufacturing process of a semiconductor device of the invention.

Next, as shown in FIG. 1C, a part of the insulating layer 103 is selectively removed to partially expose the element formation layer 104. Thus, insulating layers 111 isolated from each other are formed. It is preferable as shown in FIG. 12 that the insulating layer 103 which overlaps with a peripheral portion 117 of a region 116 where the thin film integrated circuits are formed in the element formation layer 104 be partially removed. As a method for selectively removing a part of the insulating layer 103, a chemical removing method such as dry etching or wet etching or a physical removing method such as dicing with a blade or laser cutting can be appropriately used.

By using the aforementioned physical removing method, the surface of the element formation layer 104 is slightly etched. At this time, the etched surface has irregularities. When such irregularities are produced, the adhesion between the element formation layer 104 and a second flexible substrate 115 (which is later to be attached to the surface of the element formation layer 104) with an adhesive agent 114 can be increased, which is preferable.

In addition, it is preferable that the surface of the element formation layer 104 which is exposed as a result of selectively removing the insulating layer 103 be formed of an organic compound. Further, when the surface of the element formation layer 104 is not an organic compound layer, the element formation layer may be partially removed so that an organic compound layer inside the element formation layer is exposed. Consequently, the adhesion between the element formation layer and the adhesive agent can be increased in attaching a flexible substrate to the surface of the element formation layer 104 with an adhesive agent later.

Figure 1D:
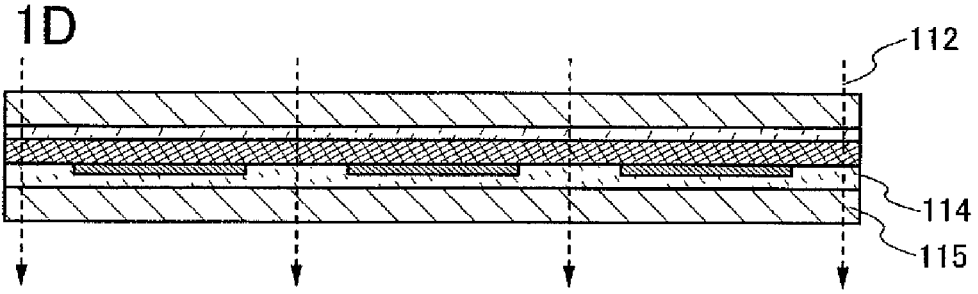

Next, as shown in FIG. 1D, the second flexible substrate 115 is attached to the isolated insulating layers 111 and exposed portions of the element formation layer 104, with the adhesive agent 114. The adhesive agent 114 can be formed by appropriately using the same material as the adhesive agent 105, while the second flexible substrate 115 can be formed by appropriately using the same material as the first flexible substrate 106. Here, since the surface of the organic compound layer in the element formation layer 104, and the adhesive agent made of an organic compound are attached to each other on the periphery of the isolated insulating layers 111, adhesion in that region is high.

Figure 1E:
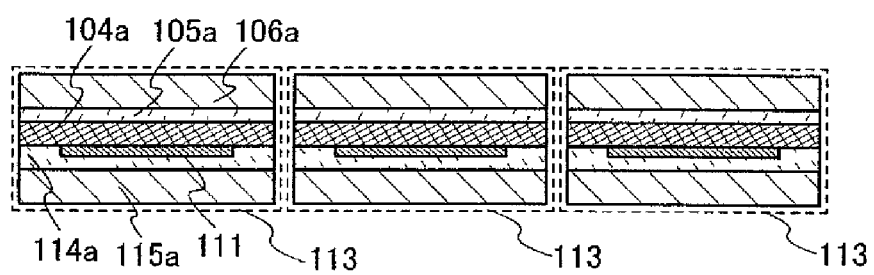

Next, a region where the element formation layer 104 and the adhesive agent 114 are attached to each other, i.e., a region where the first flexible substrate 106, the adhesive agent 105, the element formation layer 104, the adhesive agent 114, and the second flexible substrate 115 are stacked is cut off by a cutter. Consequently, semiconductor devices 113 as shown in FIG. 1E can be manufactured, each of which has an isolated first flexible substrate 106a, an isolated adhesive agent 105a, the isolated element formation layer 104 (hereinafter also referred to as a thin film integrated circuit 104a), the isolated insulating layer 111, an isolated adhesive agent 114a, and an isolated second flexible substrate 115a.

In the semiconductor device 113 herein, the isolated insulating layer 111 is not exposed at the edge. In other words, an edge of the isolated insulating layer 111 is located inside an edge of the second flexible substrate 115a. That is, an interface between the isolated insulating layer 111 and the thin film integrated circuit 104a, an interface between the isolated insulating layer 111 and the isolated adhesive agent 114a, and the like, which have poor adhesion, are not exposed at the edge, while interfaces between the isolated first flexible substrate 106a, the isolated adhesive agent 105a, the thin film integrated circuit 104a, the isolated adhesive agent 114a, and the isolated second flexible substrate 115a are exposed at the edge. Therefore, adhesion of each layer is high at the edge. As a cutter, a dicing apparatus, a scribing apparatus, a laser irradiation apparatus, or the like can be used as appropriate.

Note that when a substrate having a thermoplastic resin layer formed on its surface is used as the first flexible substrate, the element formation layer can be attached to the first flexible substrate without using an adhesive agent. Specifically, when the first flexible substrate is attached to the element formation layer by compression bonding while heating the first flexible substrate, the thermoplastic resin layer on the surface becomes plastic, and thus it functions as an adhesive agent. Accordingly, the element formation layer and the first flexible substrate can be attached to each other. After that, by cooling the first flexible substrate, the thermoplastic resin layer is cured. Consequently, the first flexible substrate can be attached to the element formation layer without using an adhesive agent. Note that the same can be said for the case of forming the second flexible substrate by using a substrate having a thermoplastic resin layer formed on its surface.

When each of the first flexible substrate 106 and the second flexible substrate 115 is formed by using a substrate having a thermoplastic resin layer formed on its surface, the first flexible substrate 106 contacts the element formation layer 104 in FIG. 1A, while the second flexible substrate 115 contacts the element formation layer 104 in FIG. 1D. A semiconductor device manufactured with such substrates has a structure that interfaces between the isolated first flexible substrate 106a, the thin film integrated circuit 104a, and the isolated second flexible substrate 115a are exposed at the edge.

Figure 2A:
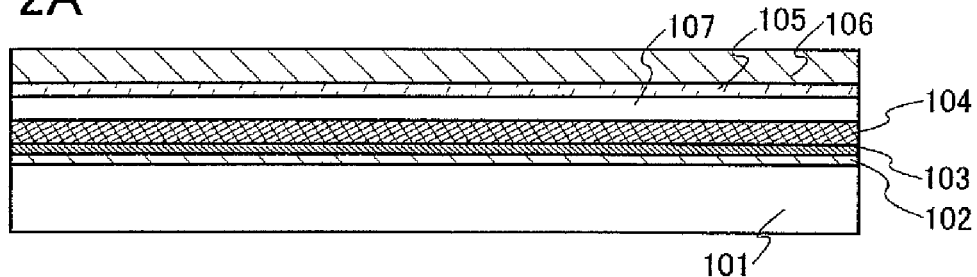
FIGS. 2A to 2E are cross-sectional views showing a manufacturing process of a semiconductor device of the invention.
Figure 2B:
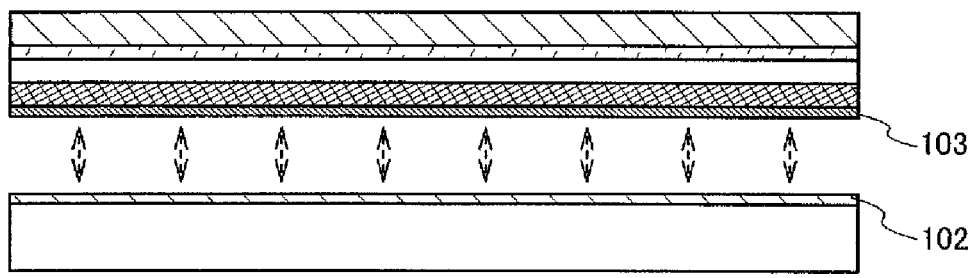
Figure 2C:
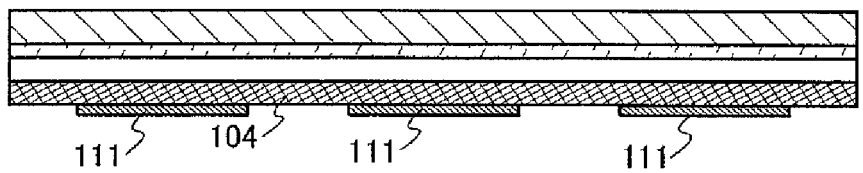

Note that an organic resin layer 107 with a thickness of 5 to 10 µm may be provided over the element formation layer 104 as shown in FIG. 2A. In this manner, by forming the organic resin layer 107 over the element formation layer 104, crack generation in the element formation layer can be prevented during the peeling process, which leads to an improvement in yields. After that, semiconductor devices 118 can be manufactured though a similar process to FIG. 1B through FIG. 1E, as shown in FIG. 2B through FIG. 2E.

Note also that each of the semiconductor devices 118 has a structure that the isolated first flexible substrate 106a, the isolated adhesive agent 105a, the isolated organic resin layer 107a, the thin film integrated circuit 104a, the isolated insulating layer 111, the isolated adhesive agent 114a, and the isolated second flexible substrate 115a are stacked. In the semiconductor device 118 shown herein, the isolated insulating layer 111 is not exposed at the edge. In other words, an edge of the isolated insulating layer 111 is located inside an edge of the second flexible substrate 115a. That is, an interface between the isolated insulating layer 111 and the thin film integrated circuit 104a, an interface between the isolated insulating layer 111 and the isolated adhesive agent 114a, and the like, which have poor adhesion, are not exposed at the edge, while interfaces between the isolated first flexible substrate 106a, the isolated adhesive agent 105a, the isolated organic resin layer 107a, the thin film integrated circuit 104a, the isolated adhesive agent 114a, and the isolated second flexible substrate 115a are exposed at the edge. Therefore, adhesion of each layer is high at the edge.

Figure 2D:
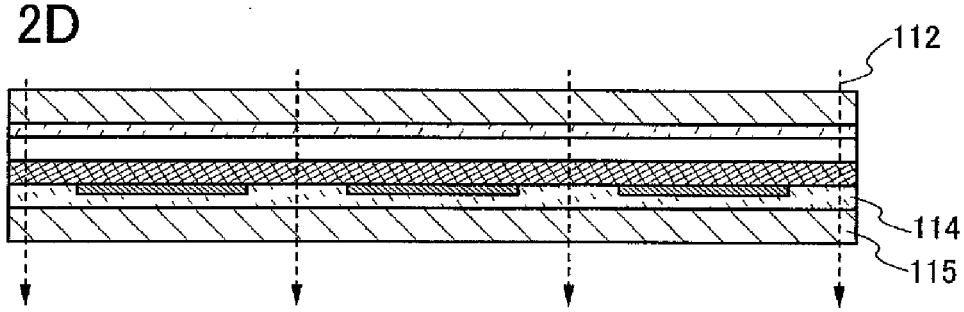
Figure 2E:
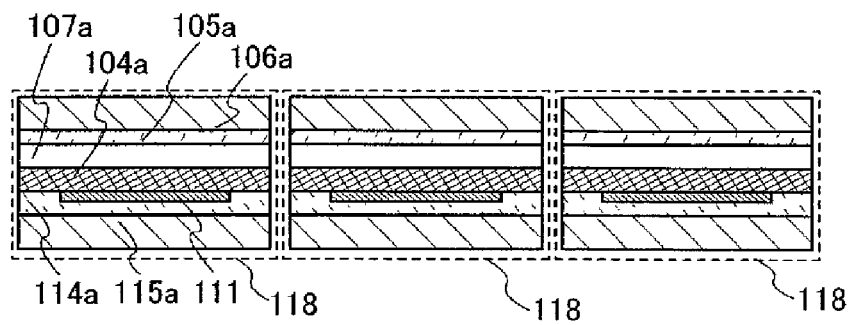

When each of the first flexible substrate 106 and the second flexible substrate 115 is formed by using a substrate having a thermoplastic resin layer formed on its surface, the first flexible substrate 106 contacts the organic resin layer 107 in FIG. 2A, while the second flexible substrate 115 contacts the element formation layer 104 in FIG. 2D. A semiconductor device manufactured with such substrates has a structure that interfaces between the isolated first flexible substrate 106a, the isolated organic resin layer 107a, the thin film integrated circuit 104a, and the isolated second flexible substrate 115a are exposed at the edge.

In accordance with this embodiment mode, a manufacturing method of a semiconductor device whose flexible substrates interposing thin film integrated circuits therebetween has high adhesion can be provided. As a result, a highly reliable semiconductor device with a waterproof property can be manufactured.

Embodiment Mode 2

Figure 3A:
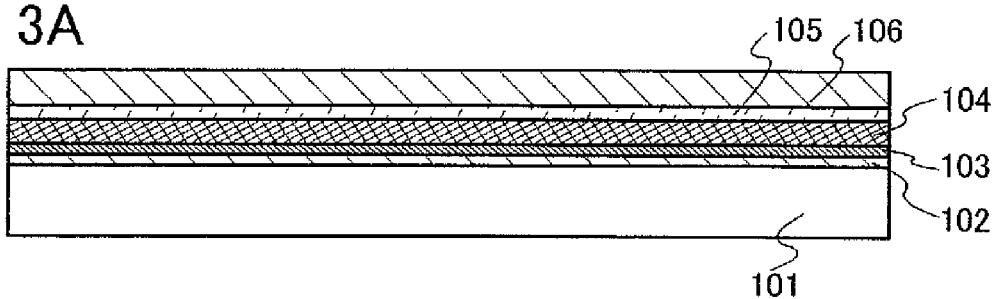
FIGS. 3A to 3E are cross-sectional views showing a manufacturing process of a semiconductor device of the invention.
Figure 3B:
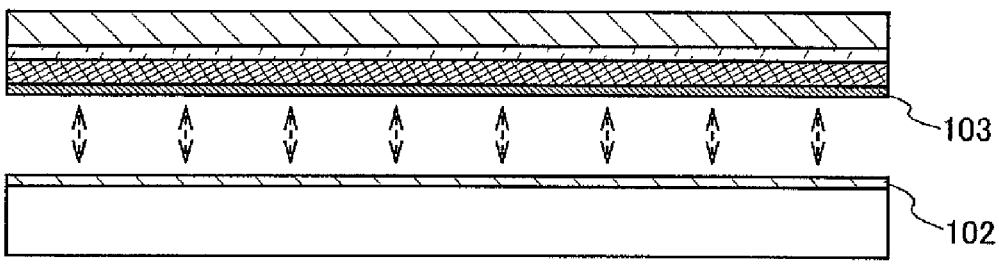
Figure 3C:
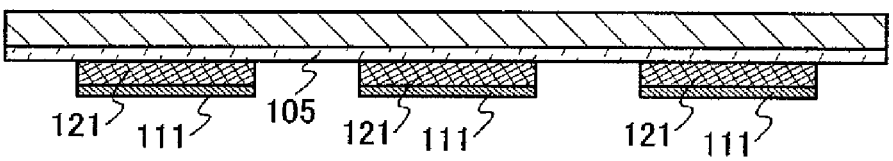
Figure 3D:
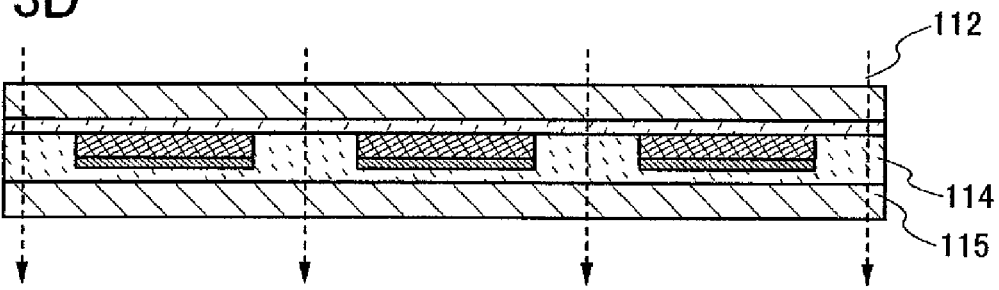
Figure 3E:
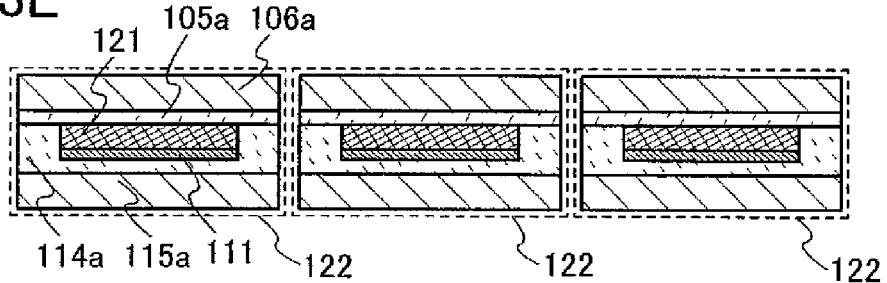
Figure 4:
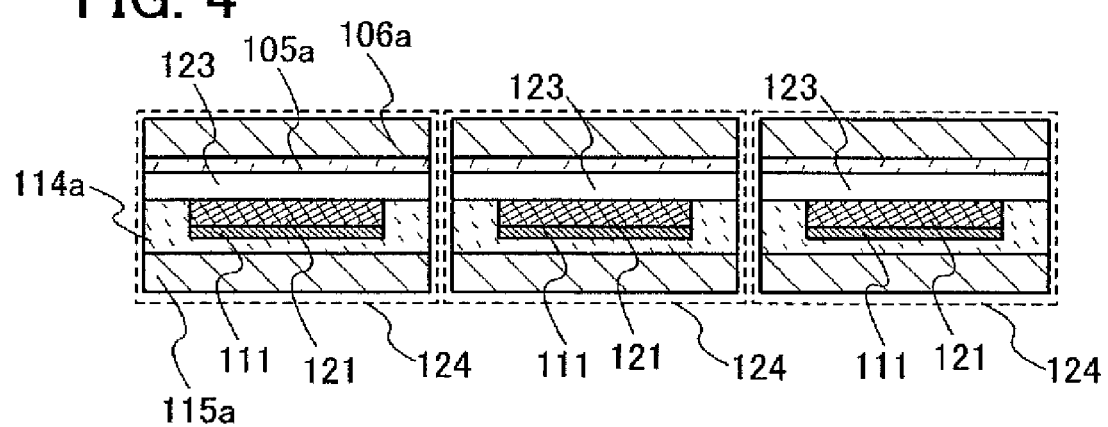
FIG. 4 is a cross-sectional view showing a structure of a semiconductor device of the invention.

In this embodiment mode, description is made of a mode where a second flexible substrate is attached after etching the element formation layer 104 in addition to the insulating layer 103, unlike Embodiment Mode 1, referring to FIG. 3A through FIG. 4. In addition, description is made of a mode where a second flexible substrate is attached after etching the element formation layer 104 and the organic resin layer in addition to the insulating layer 103, unlike Embodiment Mode 1, referring to FIG. 5A through FIG. 5E.

As shown in FIG. 3A, a peeling layer 102 is formed over a substrate 101, an insulating layer 103 is formed over the peeling layer 102, and an element formation layer 104 is formed over the insulating layer 103, similarly to Embodiment Mode 1. Then, a first flexible substrate 106 is attached to the element formation layer 104 with an adhesive agent 105.

Next, as shown in FIG. 3B, the insulating layer 103 is peeled off the peeling layer 102 similarly to Embodiment Mode 1.

Next, as shown in FIG. 3C, a part of the insulating layer 103 and the element formation layer 104 is selectively removed to partially expose the adhesive agent 105. Thus, insulating layers 111 isolated from each other and the element formation layers 104 (hereinafter also referred to as thin film integrated circuits 121) isolated from each other are formed. In this embodiment mode, it is still preferable that a peripheral region of the thin film integrated circuits formed in the element formation layer 104, and an insulating layer formed below the region be selectively removed.

Next, as shown in FIG. 3D, a second flexible substrate 115 is attached to the isolated insulating layers 111 and exposed portions of the adhesive agent 105, with an adhesive agent 114. The adhesive agent 114 can be formed by appropriately using the same material as the adhesive agent 105, while the second flexible substrate 115 can be formed by appropriately using the same material as the first flexible substrate 106. Here, since the adhesive agent 105 and the adhesive agent 114 made of organic compounds are attached to each other on the periphery of the isolated insulating layers 111 and the thin film integrated circuits 121, adhesion in that region is high.

Next, a region where the adhesive agent 105 and the adhesive agent 114 are attached to each other, i.e., a region where the first flexible substrate 106, the adhesive agent 105, the adhesive agent 114, and the second flexible substrate 115 are stacked is cut off by a cutter. Consequently, semiconductor devices 122 as shown in FIG. 3E can be manufactured, each of which has an isolated first flexible substrate 106a, an isolated adhesive agent 105a, the thin film integrated circuit 121, the isolated insulating layer 111, an isolated adhesive agent 114a, and an isolated second flexible substrate 115a.

In the semiconductor device 122 herein, the isolated insulating layer 111 and the thin film integrated circuit 121 are not exposed at the edge. In other words, an edge of the isolated insulating layer 111 and an edge of the thin film integrated circuit 121 are located inside an edge of the second flexible substrate 115a. That is, interfaces between the isolated insulating layer 111, the thin film integrated circuit 121, and the isolated adhesive agent 114a, which have poor adhesion, are not exposed at the edge, while interfaces between the isolated first flexible substrate 106a, the isolated adhesive agent 105a, the isolated adhesive agent 114a, and the isolated second flexible substrate 115a are exposed at the edge. Therefore, adhesion of each layer is high at the edge. As a cutter, those shown in Embodiment Mode 1 can be used as appropriate.

When a substrate having a thermoplastic resin layer formed on its surface is used as each of the first flexible substrate 106 and the second flexible substrate 115, the first flexible substrate 106 contacts the element formation layer 104 in FIG. 3A, while the second flexible substrate 115 contacts the first flexible substrate 106, the isolated insulating layer 111, and the edge of the thin film integrated circuit 121 in FIG. 3D. A semiconductor device manufactured with such substrates has a structure that an interface between the isolated first flexible substrate 106a and the isolated second flexible substrate 115a is exposed at the edge.

Note that in FIG. 3A, an organic resin layer may be formed over the element formation layer 104. After that, referring to FIG. 3C, a part of the insulating layer 103 and the element formation layer 104 is selectively removed to partially expose the organic resin layer. Then, the second flexible substrate 115 is attached to the isolated insulating layers 111 and the exposed organic resin layer by using the adhesive agent 114. Next, referring to FIG. 3D, a region where the organic resin layer and the adhesive agent are attached to each other, i.e., a region where the first flexible substrate 106, the adhesive agent 105, the organic resin layer, the adhesive agent 114, and the second flexible substrate 115 are stacked is cut off by a cutter.

Consequently, semiconductor devices 124 as shown in FIG. 4 can be manufactured, each of which has a stack of an isolated first flexible substrate 106a, an isolated adhesive agent 105a, an isolated organic resin layer 123, the thin film integrated circuit 121, the isolated insulating layer 111, the isolated adhesive agent 114a, and the isolated second flexible substrate 115a. In the semiconductor device 124 herein, the isolated insulating layer 111 and the thin film integrated circuit 121 are not exposed at the edge. In other words, an edge of the isolated insulating layer 111 and an edge of the thin film integrated circuit 121 are located inside an edge of the second flexible substrate 115a. That is, interfaces between the isolated insulating layer 111, the thin film integrated circuit 121, and the isolated adhesive agent 114a, which have poor adhesion, are not exposed at the edge, while interfaces between the isolated first flexible substrate 106a, the isolated adhesive agent 105a, the isolated organic resin layer 123, the isolated adhesive agent 114a, and the isolated second flexible substrate 115a are exposed at the edge. Therefore, adhesion of each layer is high at the edge.

When a substrate having a thermoplastic resin layer formed on its surface is used as each of the first flexible substrate 106 and the second flexible substrate 115, a semiconductor device with a structure that interfaces between the isolated first flexible substrate 106a, the isolated organic resin layer 123, and the isolated second flexible substrate 115a are exposed at the edge is obtained.

Figure 5A:
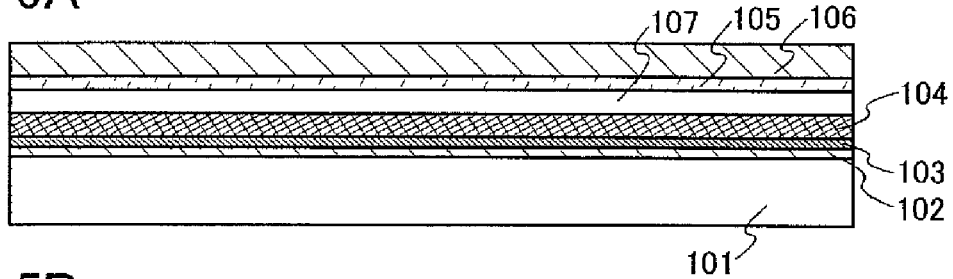
FIGS. 5A to 5E are cross-sectional views showing a manufacturing process of a semiconductor device of the invention.

Alternatively, as shown in FIG. 5A, a peeling layer 102 is formed over a substrate 101, an insulating layer 103 is formed over the peeling layer 102, an element formation layer 104 is formed over the insulating layer 103, and an organic resin layer 107 is formed over the element formation layer 104, similarly to Embodiment Mode 1. Then, a first flexible substrate 106 is attached to the organic resin layer 107 with an adhesive agent 105.

Figure 5B:
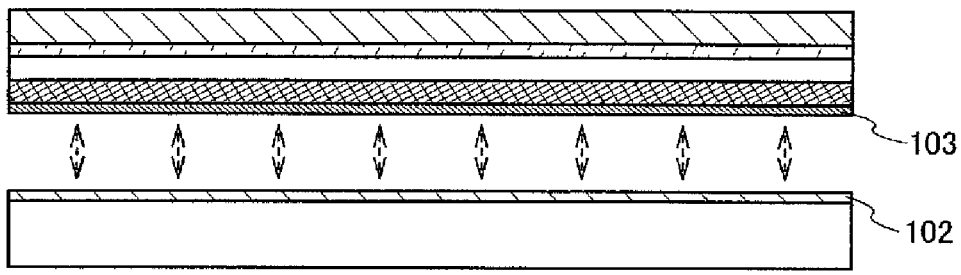

Next, as shown in FIG. 5B, the insulating layer 103 is peeled off the peeling layer 102 similarly to Embodiment Mode 1.

Figure 5C:
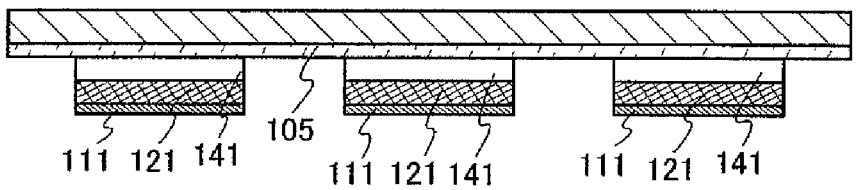

Next, as shown in FIG. 5C, a part of the insulating layer 103, the element formation layer 104, and the organic resin layer 107 is selectively removed to partially expose the adhesive agent 105. Thus, insulating layers 111 isolated from each other, thin film integrated circuits 121, and organic resin layers 141 isolated from each other are formed. In this embodiment mode, it is still preferable that a peripheral region of the thin film integrated circuits formed in the element formation layer 104, and an insulating layer and an organic resin layer formed below/over the region be selectively removed.

Figure 5D:
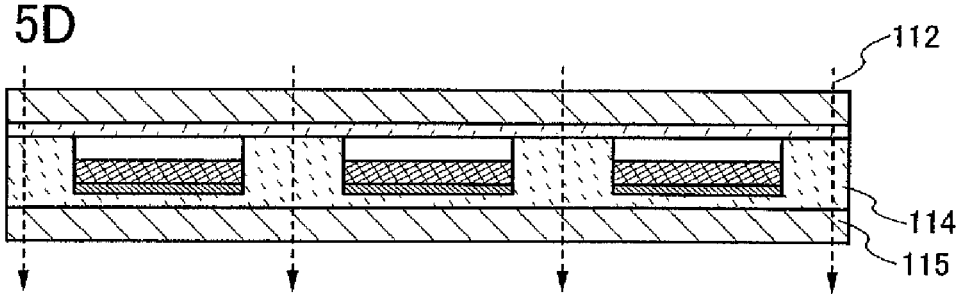

Next, as shown in FIG. 5D, a second flexible substrate 115 is attached to the isolated insulating layers 111, the thin film integrated circuits 121, the organic resin layers 141, and exposed portions of the adhesive agent 105, with an adhesive agent 114. The adhesive agent 114 can be formed by appropriately using the same material as the adhesive agent 105, while the second flexible substrate 115 can be fanned by appropriately using the same material as the first flexible substrate 106. Here, since the adhesive agent 105 and the adhesive agent 114 are attached to each other on the periphery of the isolated insulating layers 111 and the thin film integrated circuits 121, adhesion in that region is high.

Figure 5E:
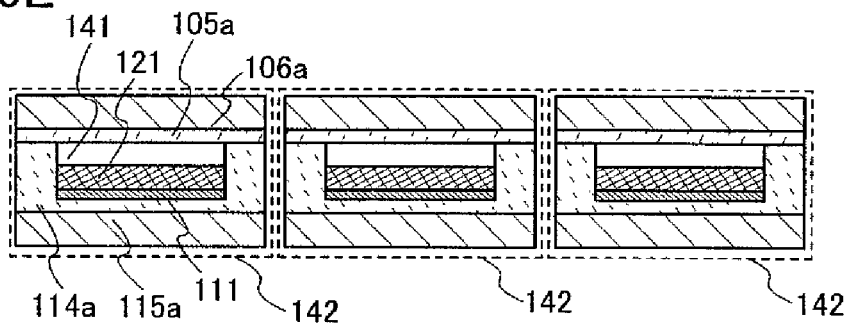

Next, a region where the adhesive agents 105 and 114, the first flexible substrate 106, and the second flexible substrate 115 are attached is cut off by a cutter. Consequently, semiconductor devices 142 as shown in FIG. 5E can be manufactured, each of which has an isolated first flexible substrate 106a, an isolated adhesive agent 105a, the isolated organic resin layer 141, the thin film integrated circuit 121, the isolated insulating layer 111, an isolated adhesive agent 114a, and an isolated second flexible substrate 115a.

In the semiconductor device 142 herein, the isolated insulating layer 111, the thin film integrated circuit 121, and the isolated organic resin layer 141 are not exposed at the edge. In other words, an edge of the isolated insulating layer 111, an edge of the thin film integrated circuit 121, and an edge of the isolated organic resin layer 141 are located inside of an edge of the second flexible substrate. That is, interfaces between the isolated insulating layer 111, the thin film integrated circuit 121, the isolated organic resin layer 141, and the isolated adhesive agent 114a, which have poor adhesion, are not exposed at the edge, while interfaces between the isolated first flexible substrate 106a, the isolated adhesive agent 105a, the isolated adhesive agent 114a, and the isolated second flexible substrate 115a are exposed at the edge. Therefore, adhesion of each layer is high at the edge. As a cutter, those shown in Embodiment Mode 1 can be used as appropriate.

When i a substrate having a thermoplastic resin layer formed on its surface is used as each of the first flexible substrate 106 and the second flexible substrate 115, the first flexible substrate 106 contacts the organic resin layer 107 in FIG. 5A, while the second flexible substrate 115 contacts the first flexible substrate 106, the isolated insulating layer 111, the edge of the thin film integrated circuit 121, and the edge of the isolated organic resin layer 107 in FIG. 5D. A semiconductor device manufactured with such substrates has a structure that interfaces between the isolated first flexible substrate 106a, the isolated adhesive agent 114a, and the isolated second flexible substrate 115a are exposed at the edge.

In accordance with this embodiment mode, a manufacturing method of a semiconductor device whose flexible substrates interposing thin film integrated circuits therebetween has high adhesion can be provided. As a result, a highly reliable semiconductor device with a waterproof property can be manufactured.

Embodiment Mode 3

Figure 6A:
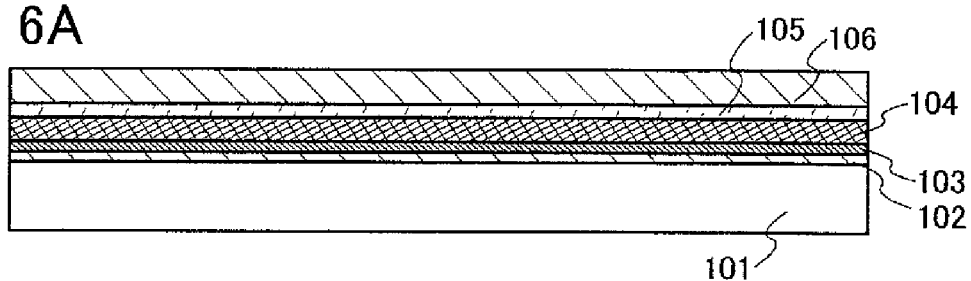
FIGS. 6A to 6E are cross-sectional views showing a manufacturing process of a semiconductor device of the invention.
Figure 6B:
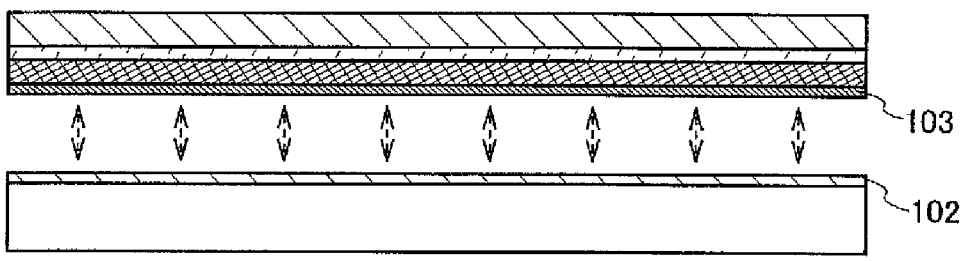
Figure 6C:
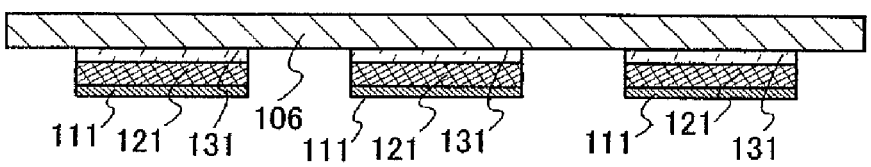
Figure 6D:
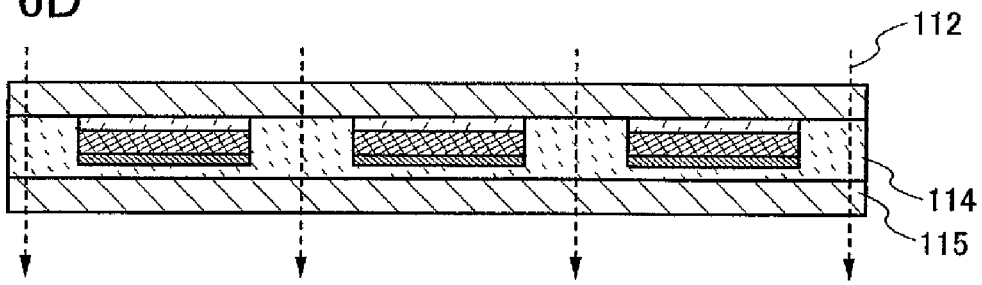
Figure 6E:
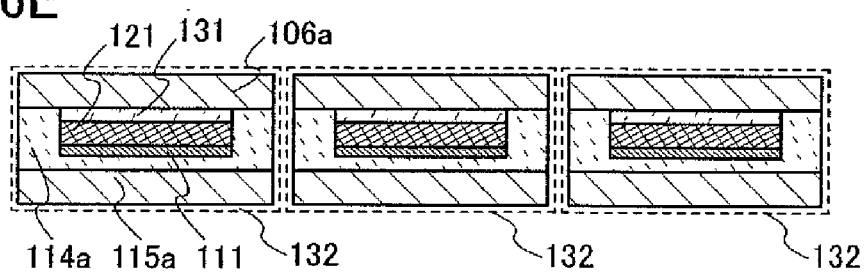
Figure 7:
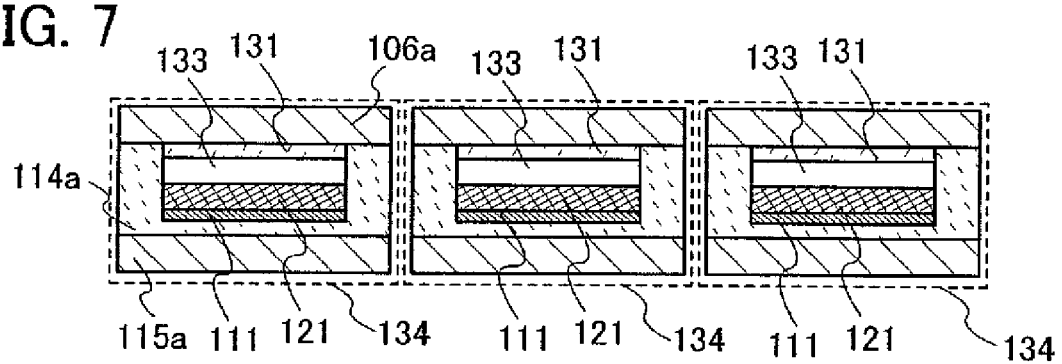
FIG. 7 is a cross-sectional view showing a structure of a semiconductor device of the invention.

In this embodiment mode, description is made of a mode where a flexible substrate is attached to the isolated insulating layer 111 and the thin film integrated circuit 121 after etching the adhesive agent 105 in addition to the insulating layer 103 and the element formation layer 104, unlike Embodiment Mode 2, referring to FIGS. 6A through 7.

As shown in FIG. 6A, a peeling layer 102 is formed over a substrate 101, an insulating layer 103 is formed over the peeling layer 102, and an element formation layer 104 is formed over the insulating layer 103, similarly to Embodiment Mode 1. Then, a first flexible substrate 106 is attached to the element formation layer 104 with an adhesive agent 105.

Next, as shown in FIG. 6B, the insulating layer 103 is peeled off the peeling layer 102 similarly to Embodiment Mode 1.

Next, as shown in FIG. 6C, a part of the insulating layer 103, the element formation layer 104, and the adhesive agent 105 is selectively removed to partially expose the first flexible substrate 106. Thus, insulating layers 111 isolated from each other, thin film integrated circuits 121, and adhesive agents 131 isolated from each other are formed. In this embodiment mode, it is still preferable that a peripheral region of the thin film integrated circuits formed in the element formation layer 104, and an insulating layer and an adhesive agent formed below/over the region be selectively removed.

Next, as shown in FIG. 6D, a second flexible substrate 115 is attached to the isolated insulating layers 111, the thin film integrated circuits 121, the isolated adhesive agents 131, and exposed portions of the first flexible substrate 106, with an adhesive agent 114. The adhesive agent 114 can be formed by appropriately using the same material as the adhesive agent 105, while the second flexible substrate 115 can be formed by appropriately using the same material as the first flexible substrate 106. Here, since the adhesive agent 114 and the first flexible substrate 106 are attached to each other on the periphery of the isolated insulating layers 111 and the thin film integrated circuits 121, adhesion in that region is high.

Next, a region where the adhesive agent 114 and the first flexible substrate 106 are attached to each other, i.e., a region where the first flexible substrate 106, the adhesive agent 114, and the second flexible substrate 115 are stacked is cut off by a cutter. Consequently, semiconductor devices 132 as shown in FIG. 6E can be manufactured, each of which has a stack of an isolated first flexible substrate 106a, an isolated adhesive agent 131, the thin film integrated circuit 121, the isolated insulating layer 111, an isolated adhesive agent 114a, and an isolated second flexible substrate 115a.

In the semiconductor device 132 herein, the isolated insulating layer 111, the thin film integrated circuit 121, and the isolated adhesive agent 105a are not exposed at the edge. In other words, an edge of the isolated insulating layer 111, an edge of the thin film integrated circuit 121, and an edge of the isolated adhesive agent 105a are located inside an edge of the second flexible substrate 115a. That is, interfaces between the isolated insulating layer 111, the thin film integrated circuit 121, the isolated adhesive agent 131, and the isolated adhesive agent 114a, which have poor adhesion, are not exposed at the edge, while interfaces between the isolated first flexible substrate 106a, the isolated adhesive agent 114a, and the isolated second flexible substrate 115a are exposed at the edge. Therefore, adhesion of each layer is high at the edge. As a cutter, those shown in Embodiment Mode 1 can be used as appropriate.

When a substrate having a thermoplastic resin layer formed on its surface is used as each of the first flexible substrate 106 and the second flexible substrate 115, the first flexible substrate 106 contacts the element formation layer 104 in FIG. 6A, while the second flexible substrate 115 contacts the first flexible substrate 106, the insulating layer 103, and the edge of the thin film integrated circuit 121 in FIG. 6D. A semiconductor device manufactured with such substrates has a structure that an interface between the isolated first flexible substrate 106a and the isolated second flexible substrate 115a is exposed at the edge.

Note that in FIG. 6A, an organic resin layer may be formed over the element formation layer 104. After that, referring to FIG. 6C, a part of the insulating layer 103, the element formation layer 104, the organic rein layer, and the adhesive agent 105 is selectively removed. Then, the second flexible substrate 115 is attached to the isolated insulating layers 111 and the exposed first flexible substrate 106 with an adhesive agent. Next, referring to FIG. 6D, a region where the adhesive agent 114, the first flexible substrate 106, and the second flexible substrate 115 are attached to each other, i.e., a region where the first flexible substrate 106, the adhesive agent 114, and the second flexible substrate 115 are stacked is cut off by a cutter. Consequently, semiconductor devices 134 as shown in FIG. 7 can be manufactured, each of which has a stack of an isolated first flexible substrate 106a, the isolated adhesive agent 131, an isolated organic resin layer 133, the thin film integrated circuit 121, the isolated insulating layer 111, an isolated adhesive agent 114a, and an isolated second flexible substrate 115a.

In the semiconductor device 134 herein, the isolated insulating layer 111, the thin film integrated circuit 121, the isolated organic resin layer 133, and the isolated adhesive agent 131 are not exposed at the edge. In other words, an edge of the isolated insulating layer 111, an edge of the thin film integrated circuit 121, an edge of the isolated organic resin layer 133, and an edge of the isolated adhesive agent 131 are located inside an edge of the second flexible substrate 115a. That is, interfaces between the isolated insulating layer 111, the thin film integrated circuit 121, the isolated organic resin layer 133, the isolated adhesive agent 131, and the isolated adhesive agent 114a, which have poor adhesion, are not exposed at the edge, while interfaces between the isolated first flexible substrate 106a, the isolated adhesive agent 114a, and the isolated second flexible substrate 115a are exposed at the edge. Therefore, adhesion of each layer is high at the edge.

When a substrate having a thermoplastic resin layer formed on its surface is used as each of the first flexible substrate 106 and the second flexible substrate 115, a semiconductor device with a structure that an interface between the isolated first flexible substrate 106a and the isolated second flexible substrate 115a is exposed at the edge is obtained.

In accordance with this embodiment mode, a manufacturing method of a semiconductor device whose flexible substrates interposing thin film integrated circuits therebetween has high adhesion can be provided. As a result, a highly reliable semiconductor device with a waterproof property can be manufactured.

Embodiment Mode 4

In this embodiment mode, description is made with reference to FIGS. 8A through 9B, of a mode which includes the steps of: stacking a peeling layer, an insulating layer, and an element formation layer over a substrate, peeling the insulating layer off the peeling layer, attaching a first flexible substrate to the insulating layer with an adhesive agent, removing a part of the insulating layer and the element formation layer to partially expose the adhesive agent, and attaching a second flexible substrate thereto.

Figure 8A:
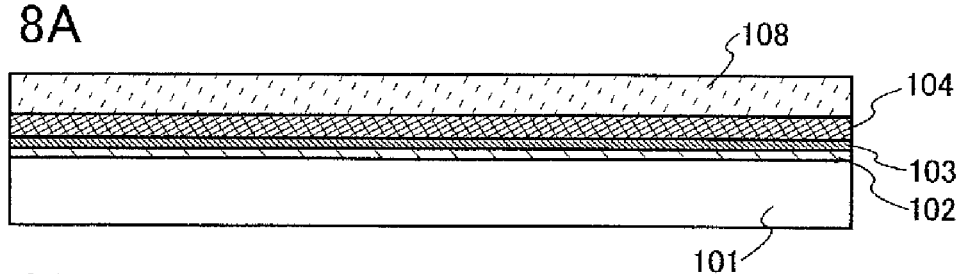
FIGS. 8A to 8F are cross-sectional views showing a manufacturing process of a semiconductor device of the invention.

As shown in FIG. 8A, a peeling layer 102 is formed over a substrate 101, an insulating layer 103 is formed over the peeling layer 102, and an element formation layer 104 is formed over the insulating layer 103, similarly to Embodiment Mode 1. Then, an adhesive member 108 is attached onto the element formation layer 104.

As the adhesive member 108, a material having an adhesive layer such as a photoplastic adhesive film, a thermoplastic adhesive film, or a pressure-bonding film can be used. Note that a tape, a sheet, a substrate, or the like can be appropriately used instead of the film. Further, instead of the adhesive member, materials such as a tape, a sheet, and a substrate may be attached to the surface of the element formation layer 104 by electrostatic force or by adsorption power.

Figure 8B:
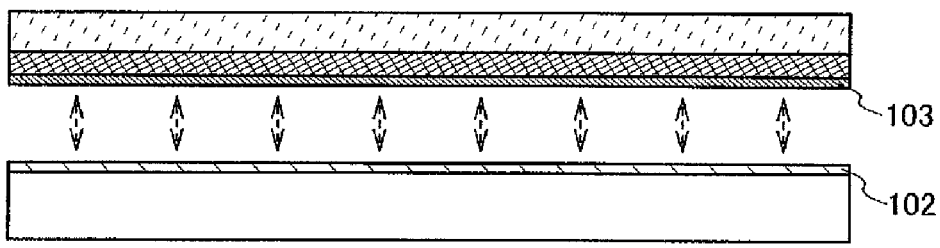

Next, as shown in FIG. 8B, the insulating layer 103 is peeled off the peeling layer 102 similarly to Embodiment Mode 1.

Figure 8C:
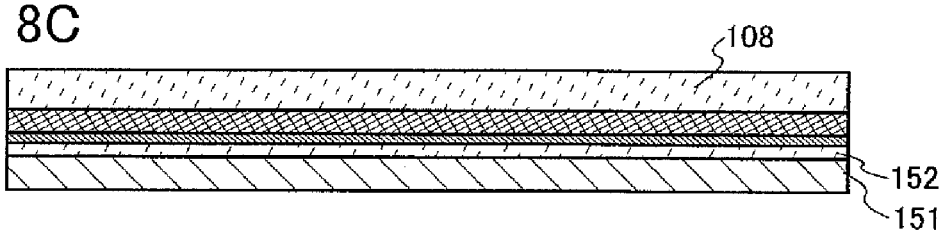

Next, as shown in FIG. 8C, a first flexible substrate 151 is attached to the insulating layer 103 with an adhesive agent 152. After that, the adhesive member 108 is peeled off the element formation layer 104.

Figure 8D:
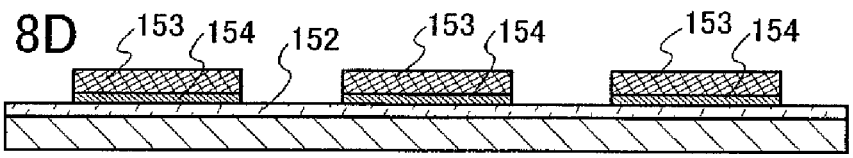

Next, as shown in FIG. 8D, a part of the element formation layer 104 and the insulating layer 103 is selectively removed to partially expose the adhesive agent 152. Thus, insulating layers 154 isolated from each other and element formation layers (hereinafter also referred to as thin film integrated circuits 153) isolated from each other are formed. In this embodiment mode, it is still preferable that a peripheral region of the thin film integrated circuits formed in the element formation layer 104, and an insulating layer formed below the region be selectively removed.

Note that it is also possible to partially expose the first flexible substrate 151 by removing a part of the adhesive agent 152 as well as the element formation layer 104 and the insulating layer 103.

Figure 8E:
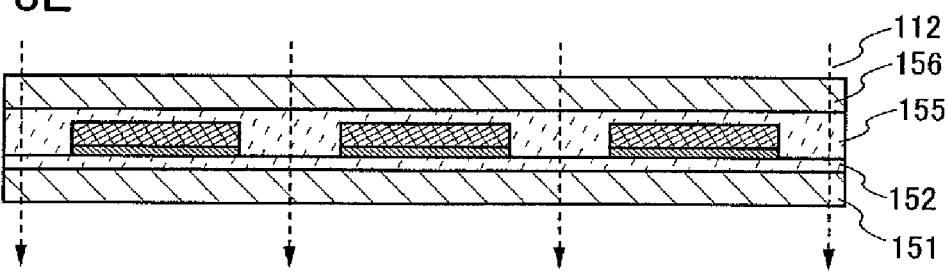

Next, as shown in FIG. 8E, a second flexible substrate 156 is attached to the thin film integrated circuits 153 and exposed portions of the adhesive agent 152 with an adhesive agent 155. The adhesive agent 155 can be formed by appropriately using the same material as the adhesive agent 105, while the second flexible substrate 156 can be formed by appropriately using the same material as the first flexible substrate 106. Here, since the adhesive agent 155 and the adhesive, agent 152 are attached to each other on the periphery of the isolated insulating layers 154 and the thin film integrated circuits 153, adhesion in that region is high.

When a substrate having a thermoplastic resin layer formed on its surface is used as each of the first flexible substrate 151 and the second flexible substrate 156, the first flexible substrate 151 contacts the insulating layer 103 in FIG. 8C, while the second flexible substrate 156 contacts the first flexible substrate 151, the thin film integrated circuit 153, and the edge of the isolated insulating layer 154 in FIG. 8E. A semiconductor device manufactured with such substrates has a structure that an interface between an isolated first flexible substrate 151a and an isolated second flexible substrate 156a is exposed at the edge.

Figure 8F:
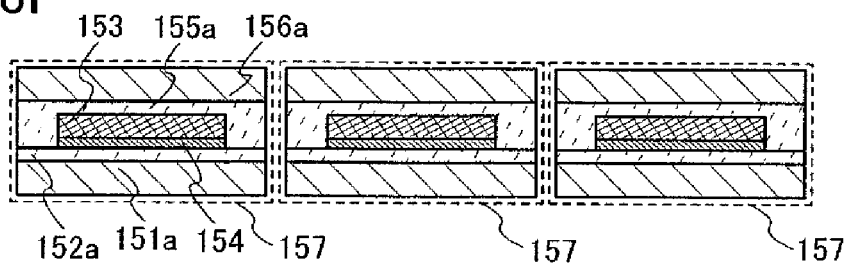

Next, a region where the adhesive agents 152 and 155, the first flexible substrate 151, and the second flexible substrate 156 are attached to each other is cut off by a cutter. Consequently, semiconductor devices 157 as shown in FIG. 8F can be manufactured, each of which has the isolated first flexible substrate 151a, an isolated adhesive agent 152a, the isolated insulating layer 154, the thin film integrated circuit 153, an isolated adhesive agent 155a, and the isolated second flexible substrate 156a.

In the semiconductor device 157 herein, the isolated insulating layer 154 and the thin film integrated circuit 153 are not exposed at the edge. In other words, an edge of the isolated insulating layer 154 and an edge of the thin film integrated circuit 153 are located inside an edge of the second flexible substrate 156a. That is, interfaces between the isolated insulating layer 154, the thin film integrated circuit 153, and the isolated adhesive agent 155a, interfaces between the isolated insulating layer 154, the isolated thin film integrated circuit 153, and the isolated adhesive agent 152a, and the like, which have poor adhesion, are not exposed at the edge, while interfaces between the isolated first flexible substrate 151a, the isolated adhesive agent 155a, the isolated adhesive agent 152a, and the isolated second flexible substrate 156a are exposed at the edge. Therefore, adhesion of each layer is high at the edge. As a cutter, those shown in Embodiment Mode 1 can be used as appropriate.

Note that in FIG. 8A, an organic resin layer may be provided over the element formation layer 104, followed by attachment of the adhesive member 108 onto the organic resin layer. After that, referring to FIG. 8D, a part of the insulating layer 103, the element formation layer 104, and the organic resin layer is selectively removed to partially expose the adhesive agent 152. After that, referring to FIG. 8E, the second flexible substrate 156 is attached to the isolated organic resin layer and exposed portions of the adhesive agent 152 with the adhesive agent 155. Then, a region where the first flexible substrate 151, the adhesive agent 152, the adhesive agent 155, and the second flexible substrate 156 are attached to each other is cut off by a cutter.

Figure 9A:
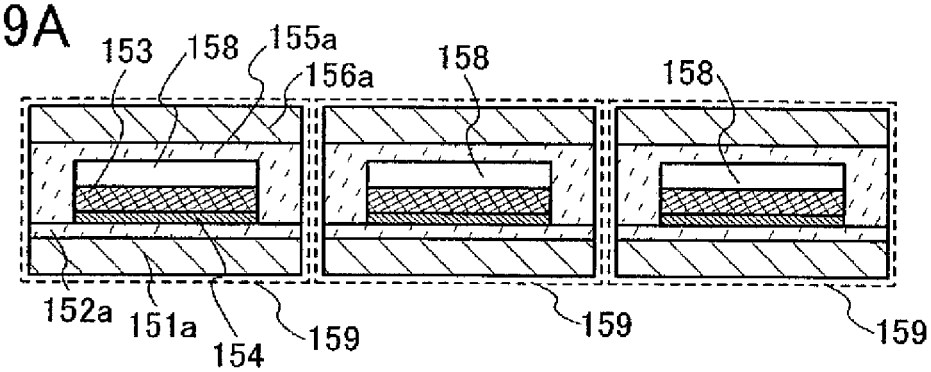
FIGS. 9A and 9B are cross-sectional views showing structures of a semiconductor device of the invention.

Consequently, semiconductor devices 159 as shown in FIG. 9A can be provided, each of which has a stack of an isolated first flexible substrate 151a, an isolated adhesive agent 152a, the isolated insulating layer 154, the thin film integrated circuit 153, an isolated organic resin layer 158, an isolated adhesive agent 155a, and an isolated second flexible substrate 156a.

In the semiconductor device 159 herein, the isolated insulating layer 154, the thin film integrated circuit 153, and the isolated organic resin layer 158 are not exposed at the edge. In other words, an edge of the isolated insulating layer 154, an edge of the thin film integrated circuit 153, and an edge of the isolated organic resin layer 158 are located inside an edge of the second flexible substrate 156a. That is, interfaces between the isolated insulating layer 154, the thin film integrated circuit 153, the isolated organic resin layer 158, and the isolated adhesive agent 155a, interfaces between the isolated insulating layer 154, the thin film integrated circuit 153, the isolated organic resin layer 158, and the isolated adhesive agent 152a, and the like, which have poor adhesion, are not exposed at the edge, while interfaces between the isolated first flexible substrate 151a, the isolated adhesive agent 152a, the isolated adhesive agent 155a, and the isolated second flexible substrate 156a are exposed at the edge. Therefore, adhesion of each layer is high at the edge.

When a substrate having a thermoplastic resin layer formed on its surface is used as each of the first flexible substrate 151 and the second flexible substrate 156, a semiconductor device with a structure that an interface between the isolated first flexible substrate 151a and the second isolated flexible substrate 156a is exposed at the edge is obtained.

Alternatively, a connecting terminal is formed on the surface of each thin film integrated circuit formed in the element formation layer 104 in FIG. 8A, and a substrate having a plurality of conductive layers which function as an antenna is used as the second flexible substrate 156 in FIG. 8E. Further, an anisotropic conductive adhesive agent is used for the adhesive agent 155, and a region where the first flexible substrate 151, the adhesive agent 152, the anisotropic conductive adhesive agent, and the second flexible substrate 156 are attached to each other is cut off by a cutter.

Figure 9B:
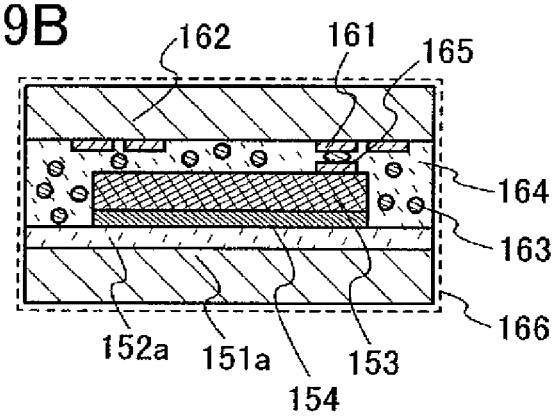

Consequently, a semiconductor device 166 as shown in FIG. 9B can be provided, which has a stack of the isolated first flexible substrate 151a, the isolated adhesive agent 152a, the isolated insulating layer 154, the thin film integrated circuit 153 having a connecting terminal 165 on its surface, an isolated anisotropic conductive adhesive agent 164, and an isolated second flexible substrate 162.

In the semiconductor device 166 herein, the isolated insulating layer 154 and the thin film integrated circuit 153 are not exposed at the edge. In other words, an edge of the isolated insulating layer 154 and an edge of the thin film integrated circuit 153 are located inside an edge of the second flexible substrate 162. That is, interfaces between the isolated insulating layer 154, the thin film integrated circuit 153, and the isolated adhesive agent 152a, interfaces between the isolated insulating layer 154, the thin film integrated circuit 153, and the isolated anisotropic conductive adhesive agent 164, and the like, which have poor adhesion, are not exposed at the edge, while interfaces between the isolated first flexible substrate 151a, the isolated adhesive agent 152a, the isolated anisotropic conductive adhesive agent 164, and the isolated second flexible substrate 162 are exposed at the edge. Therefore, adhesion of each layer is high at the edge.

Note that conductive particles 163 are dispersed in the isolated anisotropic conductive adhesive agent 164, and thus the connecting terminal 165 is electrically connected to a conductive layer 161 functioning as an antenna formed over the isolated second flexible substrate 162, through the conductive particles 163.

The anisotropic conductive adhesive agent 164 is an adhesive resin in which the conductive particles 163 (with a grain size of several nm to several tens of μm, or preferably about 3 to 7 μm) are dispersed. An epoxy rein, a phenol resin, and the like are given as examples of such an adhesive resin. In addition, the conductive particle 163 is formed from one or more elements selected from among gold, silver, copper, palladium, and platinum. Alternatively, a particle having a multilayer structure of such elements can be used. It is also possible to use a conductive particle obtained by coating the surface of a particle made of a resin, with a thin film made of one or more elements selected from among gold, silver, copper, palladium, and platinum.

In accordance with this embodiment mode, a manufacturing method of a semiconductor device whose flexible substrates interposing thin film integrated circuits therebetween has high adhesion can be provided. As a result, a highly reliable semiconductor device with a waterproof property can be manufactured.

Embodiment 1

Figure 13:
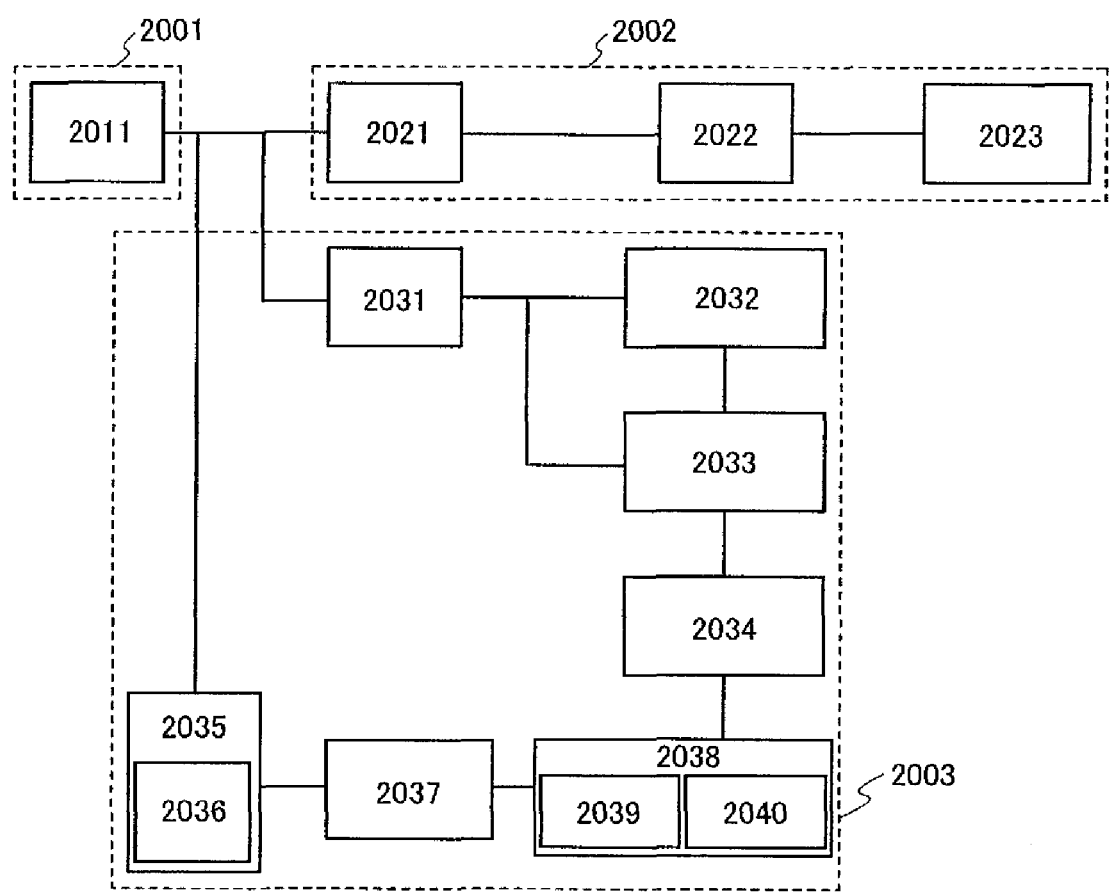
FIG. 13 shows a configuration of a semiconductor device of the invention.

In this embodiment, description is made of a configuration of a semiconductor device capable of wireless data transmission, with reference to FIG. 13.

The semiconductor device in this embodiment includes an antenna section 2001, a power supply section 2002, and a logic section 2003, as the main components.

The antenna section 2001 includes an antenna 2011 for receiving external signals and transmitting data. The signal transmission method of the semiconductor device may be any of an electromagnetic coupling method, an electromagnetic induction method, or a microwave method.

Figure 14A:
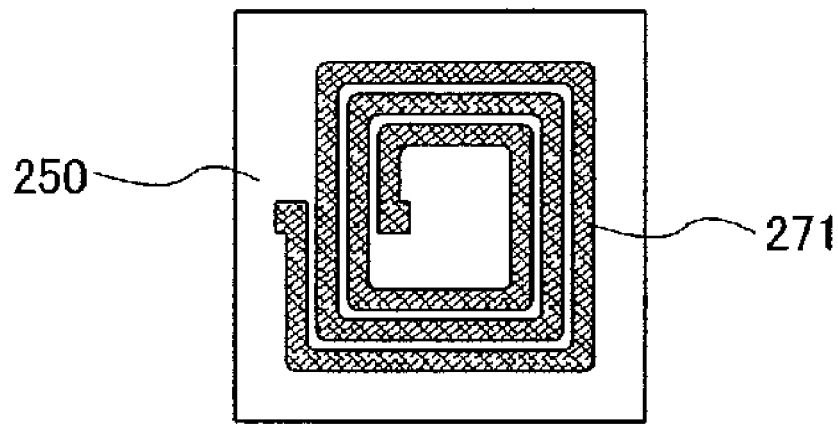
FIGS. 14A to 14C show structures of an antenna applicable to the invention.
Figure 14B:
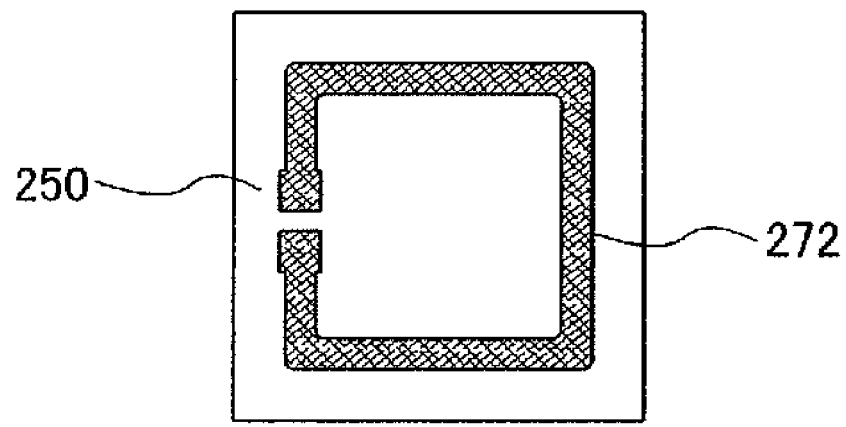

In the case of using an electromagnetic coupling method or an electromagnetic induction method (e.g., 13.56 MHz) as the signal transmission method of the semiconductor device, the shape of the antenna 2011 can be a rectangular coiled shape 271 as shown in FIG. 14A or a circular coiled shape (e.g., a spiral antenna) in order to utilize an electromagnetic induction caused by changes in the density of a magnetic field. Alternatively, the antenna can have a rectangular-loop shape 272 as shown in FIG. 14B or a circular-loop shape.

Figure 14C:

In the case of using a microwave method (e.g., UHF band (860 to 960 MHz) or 2.45 GHz), the shape (e.g., length) of a conductive layer functioning as an antenna may be determined appropriately by taking into consideration the wavelength of electromagnetic waves that are used for signal transmission. For example, a linear-dipole shape 273 as shown in FIG. 14C, a curved dipole shape, or a plane shape (e.g., a patch antenna) can be used.

The power supply section 2002 includes a rectifier circuit 2021 for generating power from a signal received from outside through the antenna 2011, a storage capacitor 2022 for storing the power generated, and a constant voltage circuit 2023 for generating a constant voltage to be supplied to each circuit.

The logic section 2003 includes a demodulation circuit 2031 for demodulating a signal received, a clock generation/correction circuit 2032 for generating clocks, a code recognition/judgment circuit 2033, a memory controller 2034 for generating signals for reading out data from a memory based on the signal received, a modulation circuit 2035 for superposing an encoded signal on the signal received, an encoding circuit 2037 for encoding the data read out, and a mask ROM 2039 for storing data. Note that the modulation circuit 2035 includes a resistor 2036 for modulation.

As a memory 2038, a DRAM (Dynamic Random Access Memory), an SRAM (Static Random Access Memory), an FERAM (Ferroelectric Random Access Memory), a mask ROM (Read Only Memory), an EPROM (Electrically Programmable Read Only Memory), an EEPROM (Electrically Erasable and Programmable Read Only Memory), a flash memory, an organic memory, or the like is appropriately used. Here, a mask ROM 2039 and a rewritable memory 2040 having at least one of a DRAM, SRAM, FERAM, EPROM, EEPROM, flash memory, and organic memory are shown as the memory 2038.

A code recognized and judged by the code recognition/judgment circuit 2033 is a frame termination signal (EOF, End of Frame), a frame starting signal (SOF, Start of Frame), a flag, a command code, a mask length, a mask value, and the like. The code recognition/judgment circuit 2033 also has a cyclic redundancy check (CRC) function for discriminating send errors.

Embodiment 2

In this embodiment, description is made of a manufacturing process of a semiconductor device capable of wireless data transmission, with reference to FIGS. 10A through FIG. 11D. Note that this embodiment illustrates partial cross sections of the antenna and the constant voltage circuit 2023 in the power supply section 2002 as well as the rewritable memory 2040 in the memory 2038 and the clock generation/correction circuit 2032 in the logic section 2003, which are shown in FIG. 13 and in Embodiment Mode 1. In addition, an n-channel TFT and a p-channel TFT are shown as a part of the clock generation/correction circuit 2032 in the logic section 2003; an active matrix organic memory is shown as the rewritable memory 2040 of the memory 2038; and an n-channel TFT is shown as a part of the constant voltage circuit 2023 in the power supply section 2002.

Figure 10A:
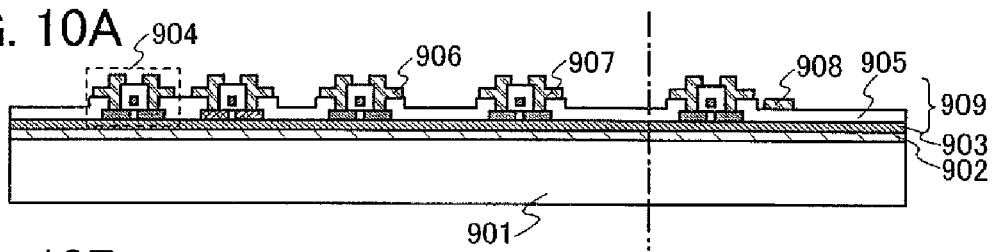
FIGS. 10A to 10E are cross-sectional views showing a manufacturing process of a semiconductor device of the invention.

As shown in FIG. 10A, a peeling layer 902 is formed over a substrate 901, an insulating layer 903 is formed over the peeling layer 902, and a thin film transistor 904 and an interlayer insulating layer 905 for insulating conductive layers of respective thin film transistors are formed over the insulating layer 903. In addition, source/drain electrodes 906 and 907 connected to semiconductor layers of the thin film transistors, and a conductive layer 908 are formed.

Here, a glass substrate is used as the substrate 901. As the peeling layer 902, a tungsten layer with a thickness of 30 nm is formed by sputtering. Then, after irradiating the surface of the peeling layer 902 with N2O plasma, a silicon oxide layer with a thickness of 200 nm, a silicon nitride oxide layer with a thickness of 50 nm, and a silicon oxynitride layer with a thickness of 100 nm are formed in this order by CVD, as the insulating layer 903.

The thin film transistor 904 includes a semiconductor layer having a source region, a drain region, and a channel formation region, a gate insulating layer, and a gate electrode. Either an n-channel TFT or a p-channel TFT is selected as appropriate as the thin film transistor 904 according to the function of each circuit.

The semiconductor layer has a crystalline structure. The crystalline semiconductor layer is obtained by irradiating an amorphous silicon film with a thickness of 66 nm with continuous wave laser light or high-repetition-rate ultrashort pulse laser light having a repetition rate of 10 MHz or higher, and a pulse width of 1 nanosecond or shorter, or preferably in the range of 1 to 100 picoseconds, inclusive. After that, the crystalline semiconductor film is selectively etched with a resist mask which is formed by a photolithography process.

As the gate insulating layer, a silicon oxide layer with a thickness of 40 nm is formed by CVD.

As the gate electrode, a tantalum nitride layer with a thickness of 30 nm and a tungsten layer with a thickness of 370 nm are stacked in this order by sputtering.

As the interlayer insulating layer 905 for insulating the conductive layers of the respective thin film transistors, a silicon oxynitride layer with a thickness of 50 nm, a silicon nitride layer with a thickness of 100 nm, and a silicon oxynitride layer with a thickness of 600 nm are formed in this order by CVD.

As the source/drain electrodes 906 and 907 and the conductive layer 908, a titanium layer, an aluminum layer, and a titanium layer are formed in this order by sputtering, and then these layers are selectively etched with a resist mask which is formed by a photolithography process.

Note that the mask ROM 2039 shown in FIG. 13 can be formed concurrently with the thin film transistor 904. The mask ROM is formed with a plurality of transistors. In this case, data can be written into a memory cell by opening a contact hole for forming a wire to be connected to, for example, a drain region of a transistor, or not opening. For example, data on 1 (on state) can be written into a memory cell by opening a contact hole, while data on 0 (off state) can be written into a memory cell by not opening a contact hole.

Before or after the light-exposure process of a photoresist formed over the interlayer insulating layer 905 with a reticle (photomask) using a light-exposure apparatus such as a stepper, the photoresist over a region where the aforementioned contact hole is to be formed is irradiated with an electron beam or laser. After that, common developing, etching, peeling of the photoresist, and the like are conducted. Thus, a pattern which has the aforementioned contact hole and a pattern which does not have such a contact hole can be formed at the same time only by selecting a region to be irradiated with an electron beam or laser, without changing the reticle (photomask). That is, by selecting a region to be irradiated with an electron beam or laser, a mask ROM in which data specific to each semiconductor device is written can be manufactured during the manufacturing process.

By using such a mask ROM, a unique identifier (UID) or the like which is specific to each semiconductor device can be formed in the manufacturing process.

Figure 10B:
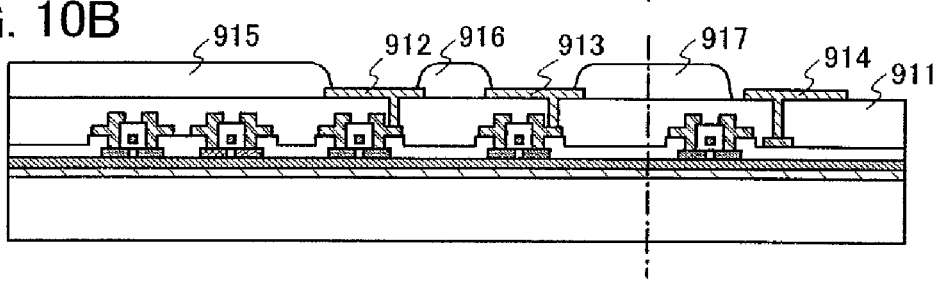

Next, as shown in FIG. 10B, an insulating layer 911 for covering the thin film transistor 904, the interlayer insulating layer 905, the source/drain electrodes 906 and 907, and the conductive layer 908 is formed. Then, conductive layers 912 to 914 are formed on the insulating layer 911 so as to be connected to the source/drain electrodes 906 and 907 and the conductive layer 908, respectively. Then, insulating layers 915 to 917 are formed to cover edges of the conductive layers 912 and 913.

The insulating layer 911 is formed through the steps of applying nonphotosensitive polyimide by spin coating; baking the nonphotosensitive polyimide at 300° C.; selectively etching the nonphotosensitive polyimide, so that the source/drain electrodes 906 and 907 and the conductive layer 908 are partially exposed. The insulating layers 915 to 917 are formed through the steps of applying photosensitive polyimide by spin coating; conducting a light exposure process and a developing process of the photosensitive polyimide, so that the conductive layers 912 to 914 are partially exposed; and baking the photosensitive polyimide at 300° C. Note that the thickness of the insulating layers 915 to 917 is set 1.5 μm. The conductive layers 912 to 914 are obtained through the steps of forming a titanium layer with a thickness of 200 nm by sputtering, and selectively etching the titanium layer with a resist mask which is formed by a photolithography process.

Figure 10C:
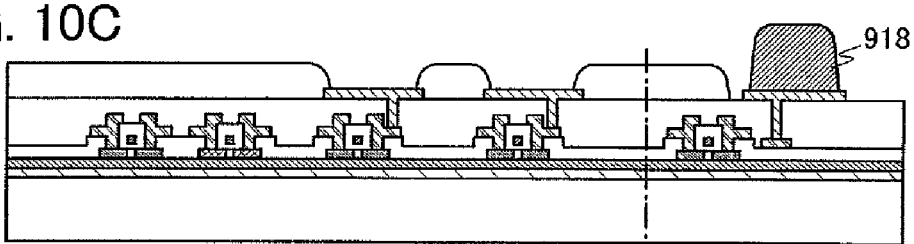

Next, a conductive layer 918 with a thickness of 5 to 20 μm is formed over the conductive layer 914 as shown in FIG. 10C. Here, the conductive layer 918 is formed by printing a composition containing silver particles by a printing method, and then baking the composition at 200° C. for 30 minutes. Note that the conductive layers 914 and 918 function as an antenna.

Note that it is also possible to obtain the conductive layer 918 through the steps of forming the conductive layer 914 using a nickel layer, and soaking the substrate in a plating solution containing Cu by a plating method. Since Ag is expensive, cost reduction can be achieved by forming the conductive layer 918 by a plating method using Cu.

Figure 10D:
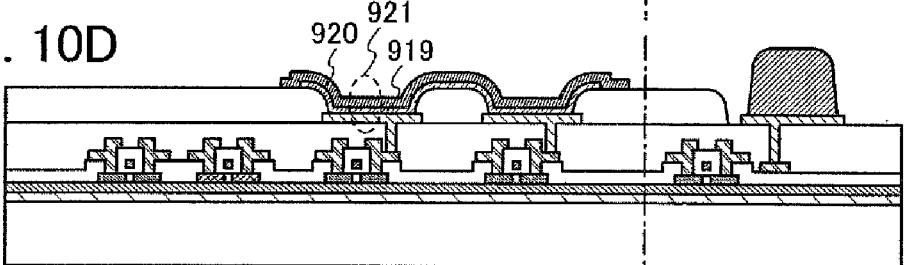

Next, as shown in FIG. 10D, a layer 919 containing an organic compound is deposited over the conductive layers 912 and 913, the insulating layer 916 which covers the edge of the conductive layers 912 and 913, and a part of the insulating layers 915 and 917. Then, a conductive layer 920 is deposited over the layer 919 containing an organic compound. With the conductive layer 912, the layer 919 containing an organic compound, and the conductive layer 920, a memory element can be formed. The layer 919 containing an organic compound can be formed by stacking a layer (with a thickness range of 1 to 4 nm, inclusive) having a function of injecting charges of holes or electrons into the layer 919 containing an organic compound by a tunneling effect from the conductive layer 920 or the conductive layer 912, and a layer including an organic compound with a hole transporting property or an organic compound with an electron transporting property. Here, the layer 919 containing an organic compound is obtained by forming a $CaF_2$ layer with a thickness of 1 nm and forming an NPB layer with a thickness of 10 nm over the $CaF_2$ layer by a vapor deposition method using a metal mask. The conductive layer 920 is obtained by stacking an In—Sn alloy layer with a thickness of 10 nm and an aluminum layer with a thickness of 100 nm by a vapor deposition method using a metal mask.

Note that as the material of the layer 919 containing an organic compound, CaF2 can be replaced by fluoride having an insulating property as typified by LiF, NaF, KF, RbF, CsF, $BeF_2$, $MgF_2$, $SrF_2$, $BaF_2$, $AlF_3$, $NF_3$, $SF_6$, AgF, $MnF_3$, or the like; chloride having an insulating property as typified by LiCl, NaCl, KCl, $BeCl_2$, $CaCl_2$, $BaCl_2$, $AlCl_3$, $SiCl_4$, $GeCl_4$, $SnCl_4$, AgCl, $ZnCl_2$, $TiCl_4$, $TiCl_3$, $ZrCl_4$, $FeCl_3$, $PdCl_2$, $SbCl_3$, $SbCl_2$, $SrCl_2$, $TlCl_3$, CuCl, $CuCl_2$, $MnCl_2$, $RuCl_2$; or the like. In addition, NPB can be replaced by phthalocyanine (abbreviation: $H_2Pc$), copper phthalocyanine (abbreviation: CuPc), N,N'-diphenyl-N,N'-bis(3-methylphenyl)-1,1'-biphenyl-4,4'-diamine (abbreviation: TPD), tris(8-quinolinolato) aluminum (abbreviation: $Alq_3$), bis(2-methyl-8-quinolinolato)(4-phenylphenolato)aluminum (abbreviation: BAlq), bathophenanthroline (abbreviation: BPhen), bathocuproin (abbreviation: BCP), polyvinylcarbazole (PVK), 2,3-bis(4-diphenylaminophenyl)quinoxaline (abbreviation: TPAQn), 2,7-di(N-carbazolyl)-spiro-9,9'-bifluorene (abbreviation: SFDCz), TPQ, 9,10-di(2-naphthyl)-2-tert-butylanthracene (abbreviation: t-BuDNA), or the like.

Data can be written into the memory element of this embodiment by applying a voltage to the conductive layers 912 and 920 to change the resistance of the memory element. Alternatively, data can be written into the memory element by forming the conductive layer 920 with a light-transmissive conductive layer made of ITO (Indium Tin Oxide), IZO (Indium Zinc Oxide), or ITO containing silicon oxide, and irradiating the memory element with laser light or an electron beam to change the resistance of the memory element. Further, data can be read out from the memory element by measuring the resistance of the memory element.

Figure 10E:
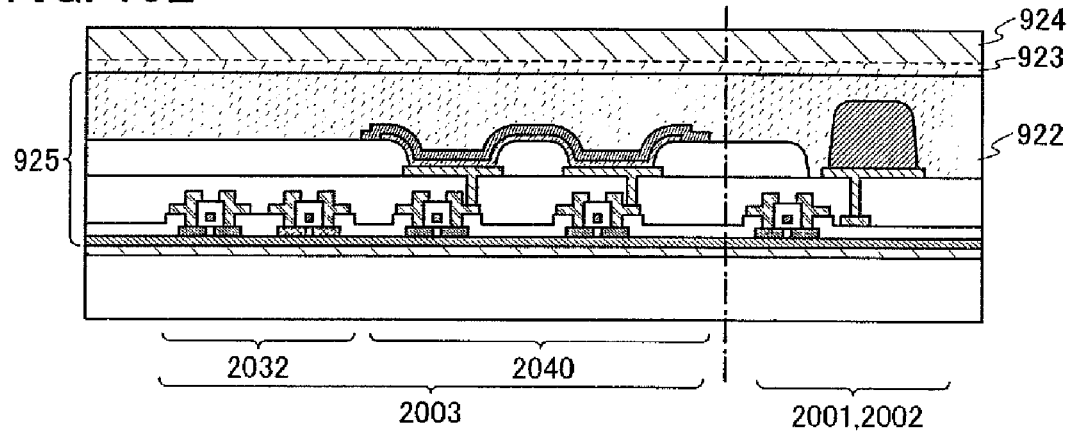

Next, as shown in FIG. 10E, an insulating layer 922 made of an organic resin or polymers is formed with a thickness of 5 to 10 μm over the insulating layer 911, the insulating layers 915 to 917, the conductive layer 920, and the conductive layer 928. The insulating layer 922 functions as a sealant, and can prevent intrusion of impurities into the thin film transistor 904 from outside. By providing the insulating layer 922, crack generation can be prevented in the thin film transistor 904, the conductive layers 914 and 918 functioning as an antenna, and the layers which constitute the memory element 921, in the later peeling process. Thus, the yield can be improved. Here, the insulating layer 922 is formed by printing an epoxy resin by a printing method and then heating the resin at 160° C. for 30 minutes.

Next, a first flexible substrate 924 is attached to the insulating layer 922. Here, a PET film which has a layer 923 made of a thermoplastic material is used as the first flexible substrate 924. By attaching the first flexible substrate 924 by thermocompression bonding at 80 to 120° C. to plasticize the thermoplastic material, and cooling it down to the room temperature, the insulating layer 922 and the first flexible substrate 924 are attached to each other with the layer 923 made of a thermoplastic material interposed therebetween.

Here, a stack having the insulating layer 903 as a bottom layer and the insulating layer 922 as a top layer is referred to as an element formation layer 925.

Figure 11A:
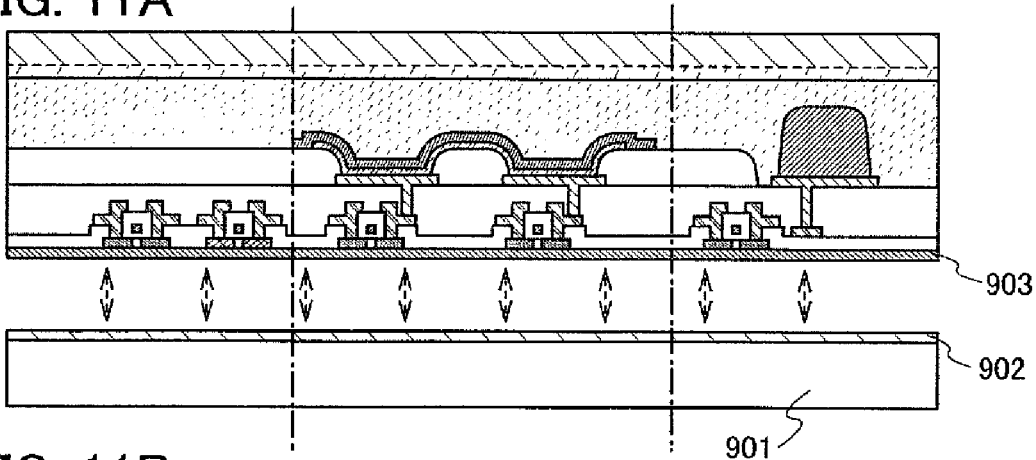
FIGS. 11A to 11D are cross-sectional views showing a manufacturing process of a semiconductor device of the invention.

Next, as shown in FIG. 11A, the substrate 901 having the peeling layer 902 and the element formation layer 925 are separated from each other by a physical method at an interface between the peeling layer 902 and the insulating layer 903. This embodiment employs a method of forming a metal oxide film between the peeling layer and the insulating layer, and then separating the element formation layer 925 at the inside of the metal oxide film by a physical method. A physical method in this embodiment corresponds to a method where an adhesive layer is provided on the surface of the substrate 901 to fix the substrate 901, and a roller having an adhesive layer is rotated on the first flexible substrate 924, so that the first flexible substrate 924 can be attached to the roller having the adhesive layer, while at the same time, separation can occur between the peeling layer 902 and the insulating layer 903.

Figure 11B:
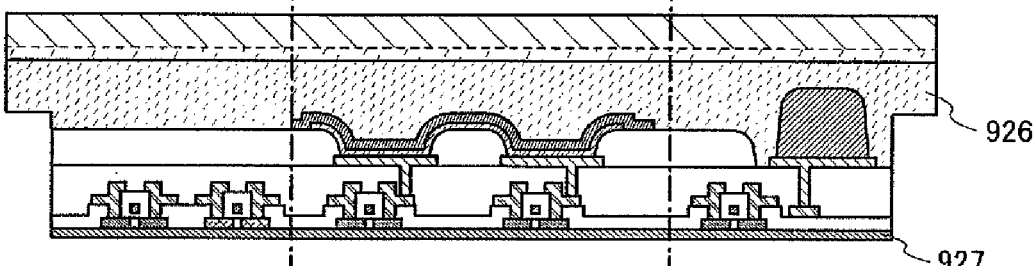

Next, as shown in FIG. 11B, the layers from the insulating layer 903 up to and including the insulating layer 922 (i.e., the insulating layer 903, the interlayer insulating layer 905, the insulating layer 911, the insulating layer 915, and the insulating layer 922) are partially removed in a peripheral region of the region where thin film integrated circuits are formed in the element formation layer 925. In this embodiment, the layers (i.e., the insulating layer 903, the interlayer insulating layer 905, the insulating layer 911, the insulating layer 915, and the insulating layer 922) are partially removed by irradiating a part of these layers with laser light. As the laser light, a fourth harmonic (wavelength: 266 nm) of a YAG laser is used. Note that after the laser irradiation, a part of the insulating layer 922 is exposed in the region which has been subjected to the laser light irradiation. The insulating layer 922 which is partially removed is represented by an insulating layer 926, and the insulating layer 903 which is partially removed is represented by an insulating layer 927.

Figure 11C:
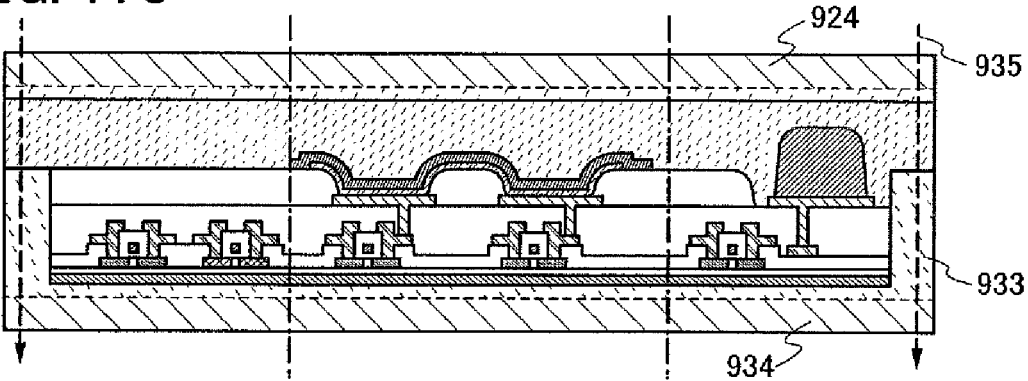

Next, as shown in FIG. 11C, a second flexible substrate 934 is attached to the insulating layers 927 and 926. Here, a PET film which has a layer 933 made of a thermoplastic material is used as the second flexible substrate 934, similarly to the first flexible substrate 924. After attaching the second flexible substrate 934 by thermocompression bonding to plasticize the thermoplastic material, and then cooling it down to the room temperature, in a similar manner to the first flexible substrate 924, the insulating layers 927 and 926 can be attached to the second flexible substrate 934 by way of the layer 933 made of a thermoplastic material. Here, all of the first flexible substrate 924, the insulating layer 926 made of an organic resin layer, and the second flexible substrate 934 are formed of organic compounds, and these layers are attached to each other. Therefore, interfaces between the first flexible substrate 924, the insulating layer 926 made of an organic resin layer, and the second flexible substrate 934 have high adhesion.

Figure 11D:
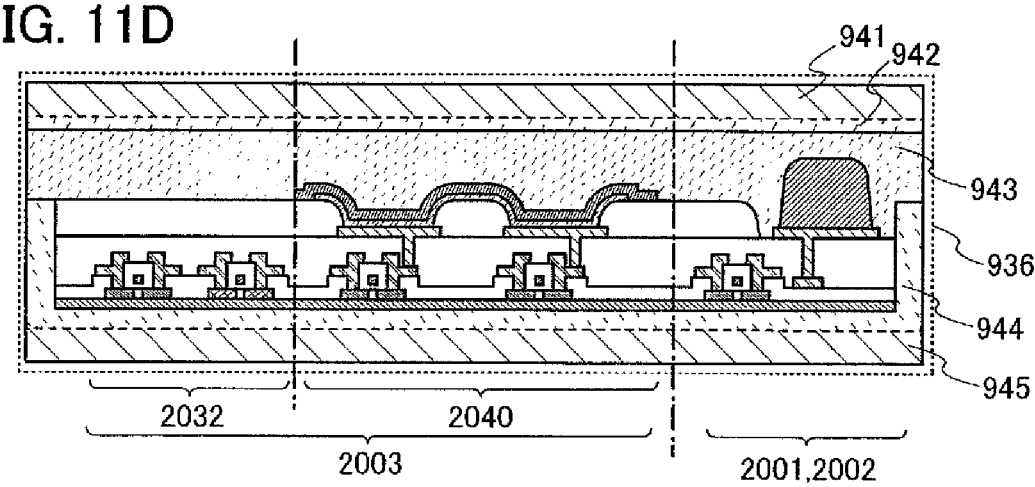

Next, a region where the first flexible substrate 924, the insulating layer 926, and the second flexible substrate 934 are attached to each other is irradiated with laser light 935, so that the layers interposed between the first flexible substrate 924 and the second flexible substrate 934 are divided into a plurality of sections. Consequently, a semiconductor device 936 as shown in FIG. 11D is formed, where an interface between the isolated insulating layer 927 and the isolated layer 933 made of a thermoplastic material, an interface between the isolated interlayer insulating layer 905 and the isolated layer 933 made of a thermoplastic material, and the like, which have poor adhesion, are not exposed, while interfaces between an isolated first flexible substrate 941, an isolated layer 942 made of a thermoplastic material, an isolated insulating layer 943, an isolated layer 944 made of a thermoplastic material, and an isolated second flexible substrate 945 are exposed. As the laser light 935, a fourth harmonic (wavelength: 266 nm) of a YAG laser is used here.

Through the aforementioned process, a highly reliable semiconductor device capable of wireless data transmission can be manufactured.

Embodiment 3

Figure 15A:
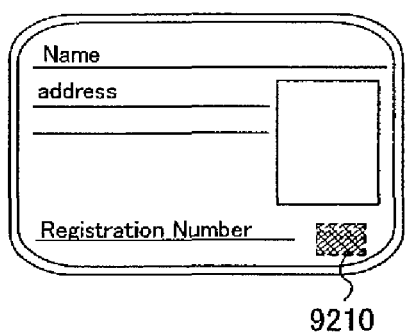
FIGS. 15A to 15F show application examples of a semiconductor device of the invention.
Figure 15B:
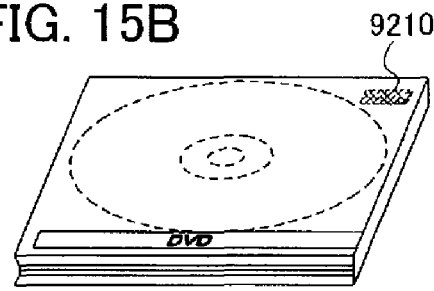
Figure 15C:
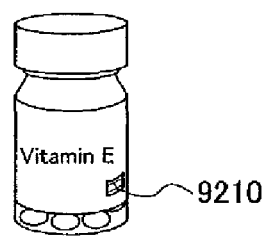
Figure 15D:
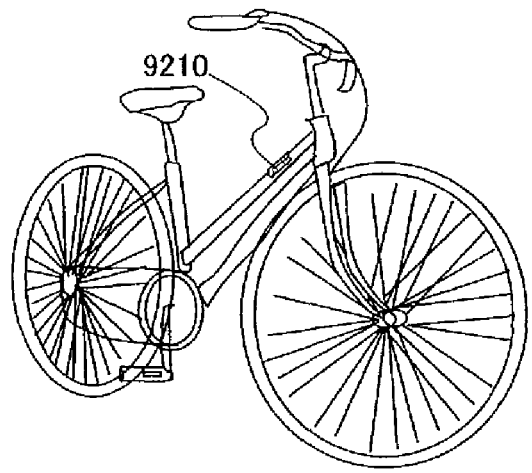
Figure 15E:
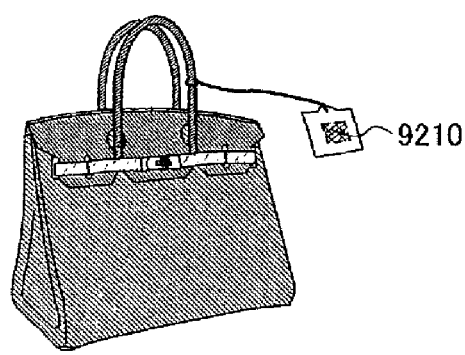
Figure 15F:
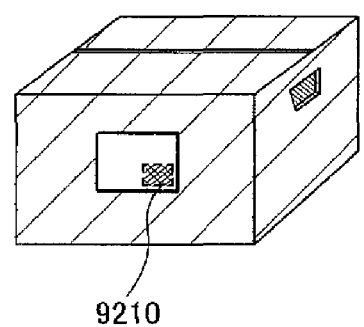

A semiconductor device capable of wireless data transmission as illustrated in the aforementioned embodiments can be applied to various uses, such as bills, coins, securities, bearer securities, documents (e.g., driver's licenses or resident's cards, see FIG. 15A), packaging containers (e.g., wrapping paper or bottles, see FIG. 15C), storage media (e.g., DVD software or video tapes, see FIG. 15B), means of transportation (e.g., bicycles, see FIG. 15D), personal ornaments and accessories (e.g., bags or glasses), foods, plants, clothing, everyday articles, tags on goods such as electronic devices or on bags (see FIGS. 15E and 15F). Further, such a semiconductor device can be attached to or implanted in animals or human bodies. Note that an electronic device includes a liquid crystal display device, an EL display device, a television set (also simply called as a TV set, a TV receiver, or a television receiver), a mobile phone, and the like.

A semiconductor device 9210 in this embodiment is fixed on goods by, for example, incorporating the device in a printed board, attaching the device to a surface, embedding the device in goods, or the like. For example, in the case of fixing the semiconductor device on a book, it can be embedded in paper, while in the case of fixing the semiconductor device on a package made of an organic resin, it can be embedded in the organic resin. Since the semiconductor device 9210 in this embodiment can realize a compact size, thin shape, and light weight, it can be fixed on goods without spoiling the design thereof. Further, when the semiconductor device in this embodiment is provided in bills, coins, securities, bearer securities, documents, or the like, authentication functions can be provided, with which forgery can be prevented. In addition, when the semiconductor device 9210 in this embodiment mode is provided in packaging containers, storage media, personal belongings, foods, plants, clothing, everyday articles, electronic devices, and the like, efficiency of systems such as an inspection system can be increased.

The present application is based on Japanese Priority application No. 2005-348968 filed on Dec. 2, 2005 with the Japanese Patent Office, the entire contents of which are hereby incorporated by reference.

What is claimed is:

1. A semiconductor device comprising:
a first flexible substrate;
a thin film integrated circuit in contact with the first flexible substrate;
an insulating layer in contact with the thin film integrated circuit; and
a second flexible substrate in contact with the insulating layer,
wherein an interface between the thin film integrated circuit and the insulating layer and an interface between the insulating layer and the second flexible substrate are not exposed.

2. The semiconductor device according to claim 1, wherein an edge of the first flexible substrate and an edge of the second flexible substrate are exposed.

3. A semiconductor device comprising:
a first flexible substrate;
a second flexible substrate;
a thin film integrated circuit interposed between the first flexible substrate and the second flexible substrate; and
an insulating layer interposed between the second flexible substrate and the thin film integrated circuit,
wherein an edge of the insulating layer is provided inside an edge of the second flexible substrate.

4. The semiconductor device according to claim 3, wherein an edge of the first flexible substrate and an edge of the second flexible substrate are exposed.

5. A semiconductor device comprising:
a first flexible substrate;
a second flexible substrate;
a thin film integrated circuit interposed between the first flexible substrate and the second flexible substrate; and
an insulating layer interposed between the second flexible substrate and the thin film integrated circuit,
wherein an edge of the insulating layer is not exposed.

6. The semiconductor device according to claim 5, wherein an edge of the first flexible substrate and an edge of the second flexible substrate are exposed.

7. A semiconductor device comprising:
a first flexible substrate;
a second flexible substrate;
a thin film integrated circuit interposed between the first flexible substrate and the second flexible substrate;
an insulating layer interposed between the second flexible substrate and the thin film integrated circuit; and
an adhesive agent interposed between the second substrate and the insulating layer,
wherein the adhesive agent is in contact with the first flexible substrate.

8. The semiconductor device according to claim 7, wherein an edge of the first flexible substrate and an edge of the second flexible substrate are exposed.

9. The semiconductor device according to claim 7, wherein the first flexible substrate comprises an organic resin.

10. A semiconductor device comprising:
a first flexible substrate;
a second flexible substrate;
a thin film integrated circuit interposed between the first flexible substrate and the second flexible substrate;
a first insulating layer interposed between the first flexible substrate and the thin film integrated circuit;
a second insulating layer interposed between the second flexible substrate and the thin film integrated circuit; and
an adhesive agent interposed between the second flexible substrate and the second insulating layer,
wherein the adhesive agent is in contact with the first insulating layer.

11. The semiconductor device according to claim 10, wherein an edge of the first flexible substrate and an edge of the second flexible substrate are exposed.

12. The semiconductor device according to claim 10, wherein the first insulating layer comprises an organic resin.

13. A semiconductor device comprising:
a first flexible substrate;
a second flexible substrate;
a thin film integrated circuit interposed between the first flexible substrate and the second flexible substrate;
a first insulating layer interposed between the first flexible substrate and the thin film integrated circuit;
a second insulating layer interposed between the second flexible substrate and the thin film integrated circuit; and
an adhesive agent interposed between the second flexible substrate and the second insulating layer,
wherein the adhesive agent is in contact with the first insulating layer, and
wherein an edge of the second insulating layer is provided inside an edge of the second flexible substrate.

14. The semiconductor device according to claim 13, wherein an edge of the first flexible substrate and an edge of the second flexible substrate are exposed.

15. The semiconductor device according to claim 13, wherein the first insulating layer comprises an organic resin.

16. A semiconductor device comprising:
a first flexible substrate;
a second flexible substrate;
a thin film integrated circuit interposed between the first flexible substrate and the second flexible substrate;
a first insulating layer interposed between the first flexible substrate and the thin film integrated circuit;
a second insulating layer interposed between the second flexible substrate and the thin film integrated circuit; and
an adhesive agent interposed between the second flexible substrate and the second insulating layer,
wherein the adhesive agent is in contact with the first insulating layer, and
wherein an edge of the second insulating layer is not exposed.

17. The semiconductor device according to claim 16, wherein an edge of the first flexible substrate and an edge of the second flexible substrate are exposed.

18. The semiconductor device according to claim 16, wherein the first insulating layer comprises an organic resin.

* * * * *